US009048367B2

(12) United States Patent
Huang et al.

(10) Patent No.: US 9,048,367 B2
(45) Date of Patent: Jun. 2, 2015

(54) MULTICHIP PACKAGE STRUCTURE FOR GENERATING A SYMMETRICAL AND UNIFORM LIGHT-BLENDING SOURCE

(71) Applicant: BRIGHTEK OPTOELECTRONIC CO., LTD., Taoyuan County (TW)

(72) Inventors: Chien Chung Huang, Taoyuan County (TW); Chih-Ming Wu, Taoyuan County (TW); Yi Hsun Chen, Taipei (TW); Chi Wei Liao, Taipei (TW)

(73) Assignee: BRIGHTEK OPTOELECTRONIC CO., LTD., Taoyuan County (TW)

( * ) Notice: Subject to any disclaimer, the term of this patent is extended or adjusted under 35 U.S.C. 154(b) by 183 days.

(21) Appl. No.: 13/787,979

(22) Filed: Mar. 7, 2013

(65) Prior Publication Data
US 2013/0320361 A1 Dec. 5, 2013

(30) Foreign Application Priority Data

Jun. 4, 2012 (TW) .............................. 101119937 A
Jun. 27, 2012 (TW) .............................. 101122974 A

(51) Int. Cl.
| H01L 33/00 | (2010.01) |
| H01L 21/00 | (2006.01) |
| H01L 33/08 | (2010.01) |
| H01L 27/15 | (2006.01) |
| H01L 27/146 | (2006.01) |
| H01L 25/16 | (2006.01) |
| H01L 25/075 | (2006.01) |
| H01L 33/38 | (2010.01) |
| H01L 33/54 | (2010.01) |
| H01L 33/48 | (2010.01) |
| H01L 33/50 | (2010.01) |
| H01L 33/62 | (2010.01) |

(52) U.S. Cl.
CPC .............. *H01L 33/08* (2013.01); *H01L 27/156* (2013.01); *H01L 33/38* (2013.01); *H01L 27/14643* (2013.01); *H01L 33/54* (2013.01); *H01L 33/486* (2013.01); *H01L 25/167* (2013.01); *H01L 25/0753* (2013.01); *H01L 33/50* (2013.01); *H01L 33/62* (2013.01); *H01L 2224/48091* (2013.01); *H01L 2224/49113* (2013.01)

(58) Field of Classification Search
CPC ..................... H01L 33/08; H01L 2224/49113; H01L 27/156; H01L 25/073; H01L 33/62; H01L 33/50; H01L 33/54; H01L 25/167; H01L 25/0753; H01L 27/14643; H01L 33/38; H01L 33/486
See application file for complete search history.

(56) References Cited

U.S. PATENT DOCUMENTS
8,039,856 B2 * 10/2011 Kim ................................ 257/98
2007/0090375 A1 4/2007 Kobilke
(Continued)

FOREIGN PATENT DOCUMENTS
| JP | 2006310613 A | 11/2006 |
| JP | 2010109170 A | 5/2010 |
| JP | 201284733 A | 4/2012 |

*Primary Examiner* — Alonzo Chambliss
(74) *Attorney, Agent, or Firm* — Li & Cai Intellectual Property (USA) Office

(57) ABSTRACT

A multichip package structure for generating a symmetrical and uniform light-blending source includes a substrate unit, a light-emitting unit and a package unit. The substrate unit includes a substrate body and at least one bridging conductive layer disposed on the top surface of the substrate body. The light-emitting unit includes at least two first light-emitting elements diagonally disposed on the substrate body and electrically connected to the substrate body and at least two second light-emitting elements diagonally disposed on the substrate body and electrically connected to the substrate body. The package unit includes at least two first light-transmitting package bodies respectively covering the at least two first light-emitting elements and at least two second light-transmitting package bodies respectively covering the at least two second light-emitting elements.

24 Claims, 19 Drawing Sheets

(56) References Cited

U.S. PATENT DOCUMENTS

| | | |
|---|---|---|
| 2007/0223219 A1 | 9/2007 | Medendorp et al. |
| 2008/0080177 A1 | 4/2008 | Chang |
| 2009/0046201 A1 * | 2/2009 | Kastilahn et al. ............. 348/375 |
| 2010/0046201 A1 * | 2/2010 | Wang et al. .................. 362/97.1 |
| 2010/0134043 A1 | 6/2010 | Kadotani et al. |
| 2010/0157583 A1 | 6/2010 | Nakajima |
| 2010/0315012 A1 | 12/2010 | Kim et al. |
| 2010/0320482 A1 * | 12/2010 | Tachibana ....................... 257/88 |

* cited by examiner

MULTICHIP PACKAGE STRUCTURE FOR GENERATING A SYMMETRICAL AND UNIFORM LIGHT-BLENDING SOURCE

BACKGROUND OF THE INVENTION

1. Field of the Invention

The instant disclosure relates to a multichip package structure, and more particularly to a multichip package structure for generating a symmetrical and uniform light-blending source.

2. Description of Related Art

The invention of the illuminating device greatly changed the style of building construction and the lifestyle of human beings, allowing people to work during the night. Traditional lighting devices such as lamps that adopt incandescent bulbs, fluorescent bulbs, or power-saving bulbs have been generally well-developed and used intensively for indoor illumination.

Moreover, compared to the newly developed light-emitting-diode (LED) illuminating devices, these traditional illuminating devices have the disadvantages of quick attenuation, high power consumption, high heat generation, short service life, high fragility, and being not recyclable. Thus, various high-powered LED illuminating devices are created to replace the traditional lighting devices.

SUMMARY OF THE INVENTION

One aspect of the instant disclosure relates to a multichip package structure for generating a symmetrical and uniform light-blending source.

One of the embodiments of the instant disclosure provides a multichip package structure for generating a symmetrical and uniform light-blending source, comprising: a substrate unit, a light-emitting unit and a package unit. The substrate unit includes a substrate body and at least one bridging conductive layer disposed on the top surface of the substrate body. The light-emitting unit includes at least two first light-emitting elements diagonally disposed on the substrate body and electrically connected to the substrate body and at least two second light-emitting elements diagonally disposed on the substrate body and electrically connected to the substrate body. The package unit includes at least two first light-transmitting package bodies respectively covering the at least two first light-emitting elements and at least two second light-transmitting package bodies respectively covering the at least two second light-emitting elements. Moreover, the multichip package structure further comprises: a frame unit including at least two first conductive frames diagonally disposed on the substrate body to respectively surround the at least two first light-emitting elements and at least two second conductive frames diagonally disposed on the substrate body to respectively surround the at least two second light-emitting elements, wherein the at least two first conductive frames are electrically connected with each other through the at least one bridging conductive layer, the at least two second conductive frames are electrically connected with each other through at least one bridging conductive wire, the at least two first light-transmitting package bodies are respectively surrounded by the at least two first conductive frames, and the at least two second light-transmitting package bodies are respectively surrounded by the at least two second conductive frames.

Another one of the embodiments of the instant disclosure provides a multichip package structure for generating a symmetrical and uniform light-blending source, comprising: a substrate unit, a light-emitting unit and a package unit. The substrate unit includes a substrate body, at least two bridging conductive layers disposed on the top surface of the substrate body and electrically connected with each other, and at least one connecting conductive layer disposed on the top surface of the substrate body and insulated from the at least two bridging conductive layers. The light-emitting unit includes at least two first light-emitting elements diagonally disposed on the substrate body and electrically connected to the substrate body and at least two second light-emitting elements diagonally disposed on the substrate body and electrically connected to the substrate body, wherein the at least two bridging conductive layers are electrically connected between the at least two first light-emitting elements, and the at least one connecting conductive layer is electrically connected between the at least two second light-emitting elements. The package unit includes at least two first light-transmitting package bodies respectively covering the at least two first light-emitting elements and at least two second light-transmitting package bodies respectively covering the at least two second light-emitting elements. Moreover, the multichip package structure further comprises: a frame unit including at least two first insulative frames diagonally disposed on the substrate body to respectively surround the at least two first light-emitting elements and at least two second insulative frames diagonally disposed on the substrate body to respectively surround the at least two second light-emitting elements, wherein the at least two first insulative frames and the at least two second insulative frames are integrated with each other to form a single frame component, the at least two first light-transmitting package bodies are respectively surrounded by the at least two first insulative frames, and the at least two second light-transmitting package bodies are respectively surrounded by the at least two second insulative frames.

Yet another one of the embodiments of the instant disclosure provides a multichip package structure for generating a symmetrical and uniform light-blending source, comprising: a substrate unit, a light-emitting unit and a package unit. The substrate unit includes a substrate body. The light-emitting unit includes at least two first light-emitting elements diagonally disposed on the substrate body and electrically connected to the substrate body and at least two second light-emitting elements diagonally disposed on the substrate body and electrically connected to the substrate body, wherein the at least two first light-emitting elements are electrically connected with each other in series, and the at least two second light-emitting elements are electrically connected with each other in series. The package unit includes at least two first light-transmitting package bodies respectively enclosing the at least two first light-emitting elements and at least two second light-transmitting package bodies respectively enclosing the at least two second light-emitting elements. Moreover, the multichip package structure further comprises: a frame unit including at least two first insulative frames diagonally disposed on the substrate body to respectively surround the at least two first light-emitting elements and at least two second insulative frames diagonally disposed on the substrate body to respectively surround the at least two second light-emitting elements, wherein the at least two first insulative frames and the at least two second insulative frames are integrated with each other to form a single frame component, the at least two first light-transmitting package bodies are respectively surrounded by the at least two first insulative frames, and the at least two second light-transmitting package bodies are respectively surrounded by the at least two second insulative frames.

Therefore, because the at least two first light-emitting elements are diagonally disposed on the substrate body and electrically connected to the substrate body and the at least two second light-emitting elements are diagonally disposed on the substrate body and electrically connected to the substrate body, thus the multichip package structure can be used to generate a symmetrical and uniform light-blending source.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

[First Embodiment]

Figure 1A:
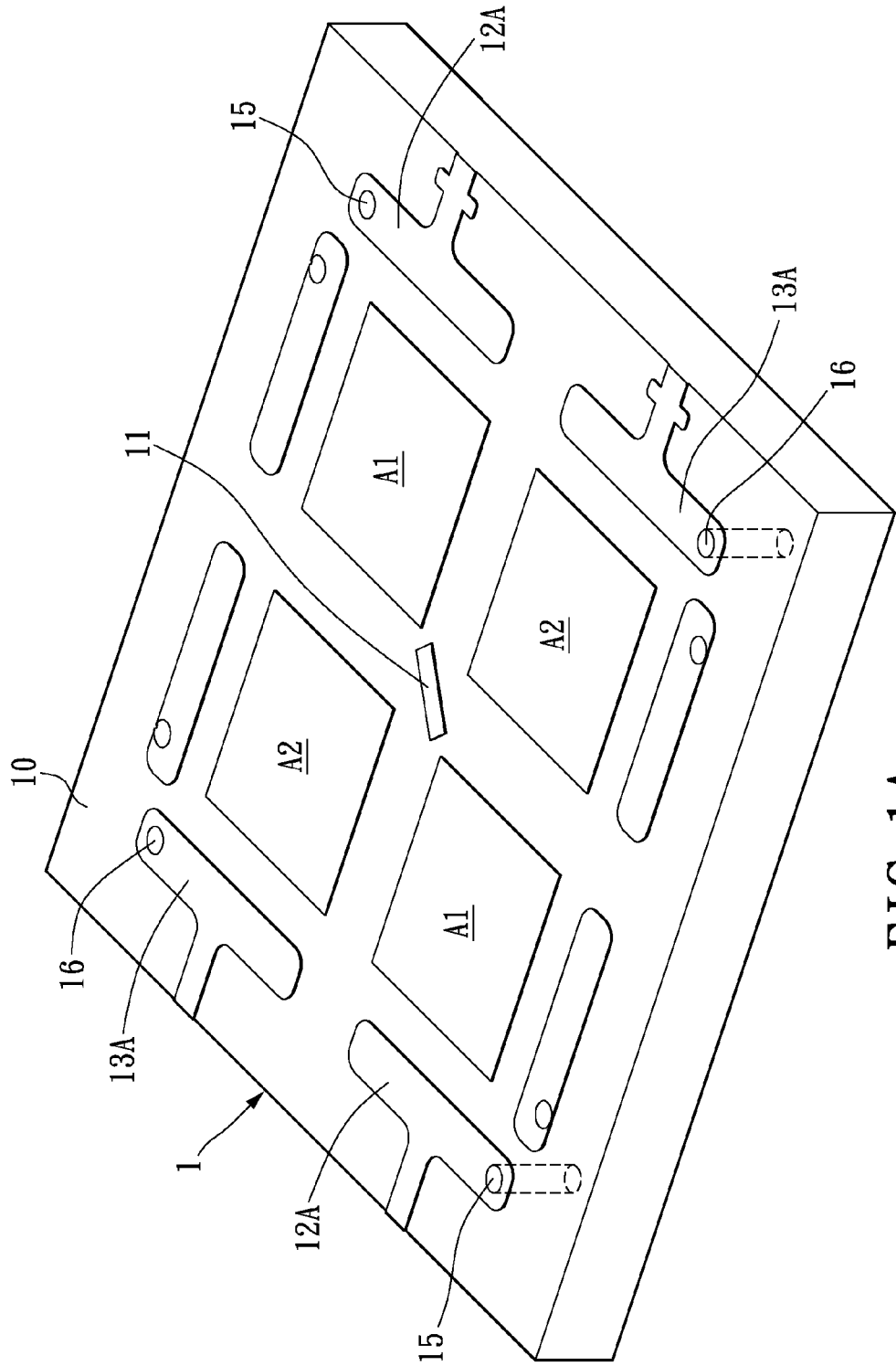
FIG. 1A shows a perspective, schematic view of the substrate unit according to the first embodiment of the instant disclosure.

Referring to FIG. 1A to FIG. 5, where the first embodiment of the instant disclosure provides a multichip package structure Z for generating a symmetrical and uniform light-blending source (i.e., the light-mixing source or the quasioptical source), comprising: a substrate unit 1, a light-emitting unit 2, a frame unit 3, a package unit 4 and a lens unit 5.

Figure 1B:
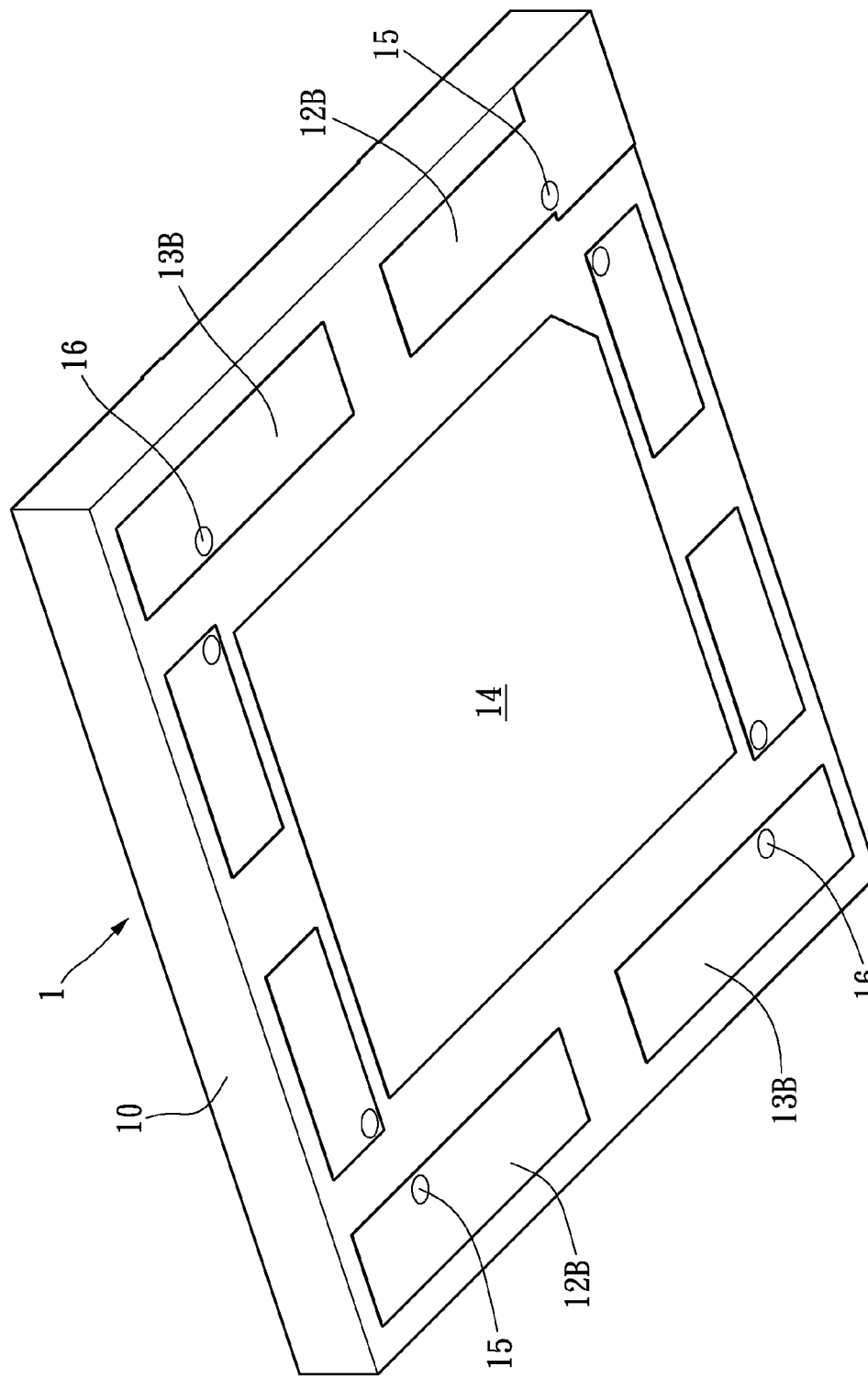
FIG. 1B shows another perspective, schematic view of the substrate unit according to the first embodiment of the instant disclosure.

First, referring to FIG. 1A and FIG. 1B, the substrate unit 1 includes a substrate body 10 and at least one bridging conductive layer 11 disposed on the top surface of the substrate body 10. For example, the substrate body 10 has at least two first chip-mounting areas A1 diagonally disposed on the top surface thereof and at least two second chip-mounting areas A2 diagonally disposed on the top surface thereof (i.e., the at least two first chip-mounting areas A1 and the at least two second chip-mounting areas A2 are arranged as a cross-diagonal matrix). The substrate unit 1 includes at least two first top conductive pads 12A diagonally disposed on the top surface of the substrate body 10 and at least two second top conductive pads 13A diagonally disposed on the top surface of the substrate body 10 (i.e., the at least two first top conductive pads 12A and the at least two second top conductive pads 13A are arranged as a cross-diagonal matrix).

For another example, the substrate unit 1 includes at least one heat-dissipating layer 14 disposed on the bottom surface of the substrate body 10 and corresponding to the light-emitting unit 2, at least two first bottom conductive pads 12B disposed on the bottom surface of the substrate body 10 and respectively electrically connected to the at least two first top conductive pads 12A, and at least two second bottom conductive pads 13B disposed on the bottom surface of the substrate body 10 and respectively electrically connected to the at least two second top conductive pads 13A.

For yet another example, the substrate unit 1 includes at least two first conductive bodies 15 passing through the substrate body 10 and at least two second conductive bodies 16 passing through the substrate body 10, where each first conductive body 15 can be electrically connected between the corresponding first top conductive pad 12A and the corresponding first bottom conductive pad 12B, and each second conductive body 16 can be electrically connected between the corresponding second top conductive pad 13A and the corresponding second bottom conductive pad 13B. In other words, the first top conductive pad 12A and the first bottom conductive pad 12B can be electrically connected with each other through the corresponding first conductive body 15, and the second top conductive pad 13A and the second bottom conductive pad 13B can be electrically connected with each other through the corresponding second conductive body 16. However, the above-mentioned design for the substrate unit 1 of the first embodiment is merely an example and is not meant to limit the instant disclosure.

Figure 2:
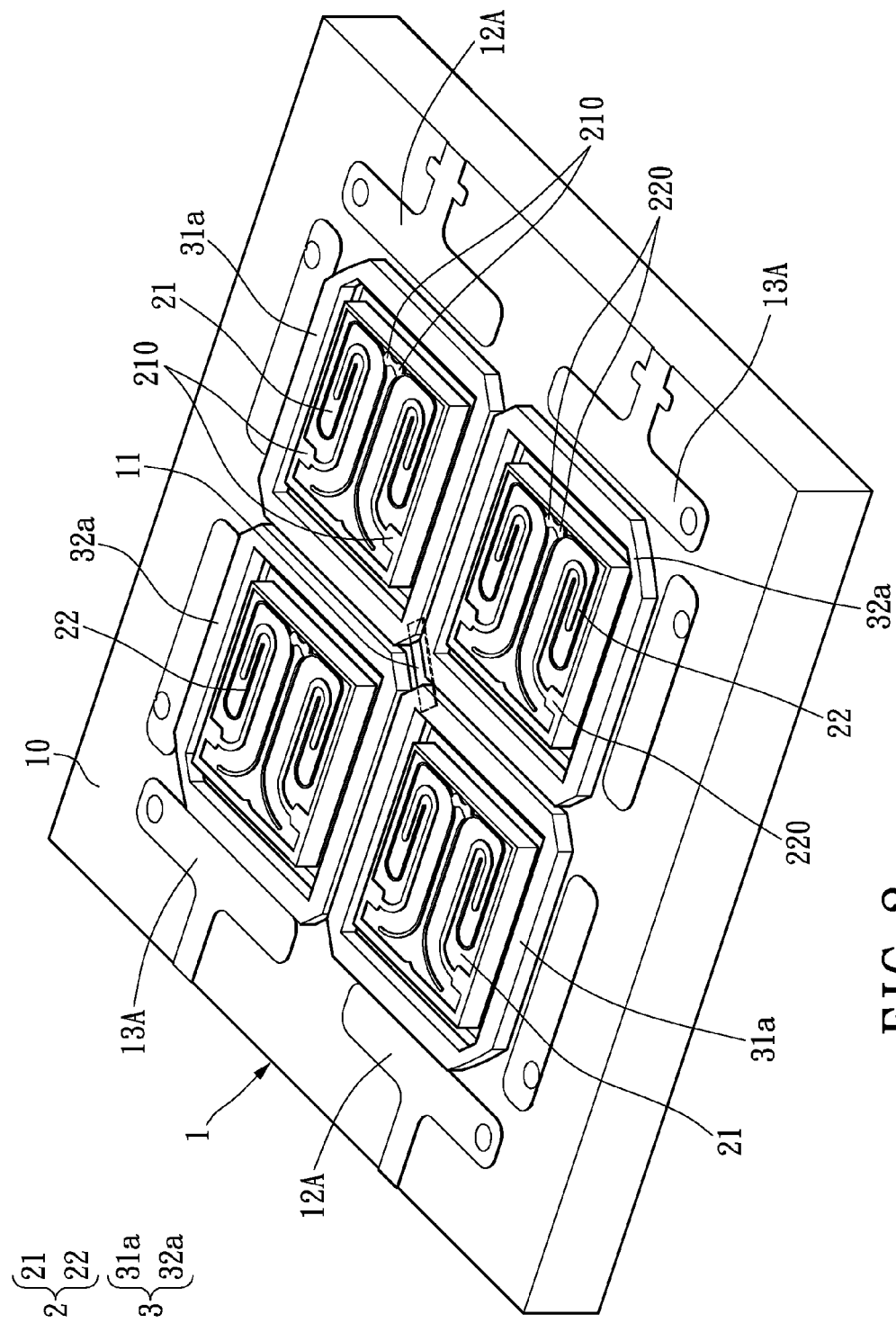
FIG. 2 shows a perspective, schematic view of the light-emitting unit and the frame unit disposed on the substrate unit according to the first embodiment of the instant disclosure.
Figure 3:
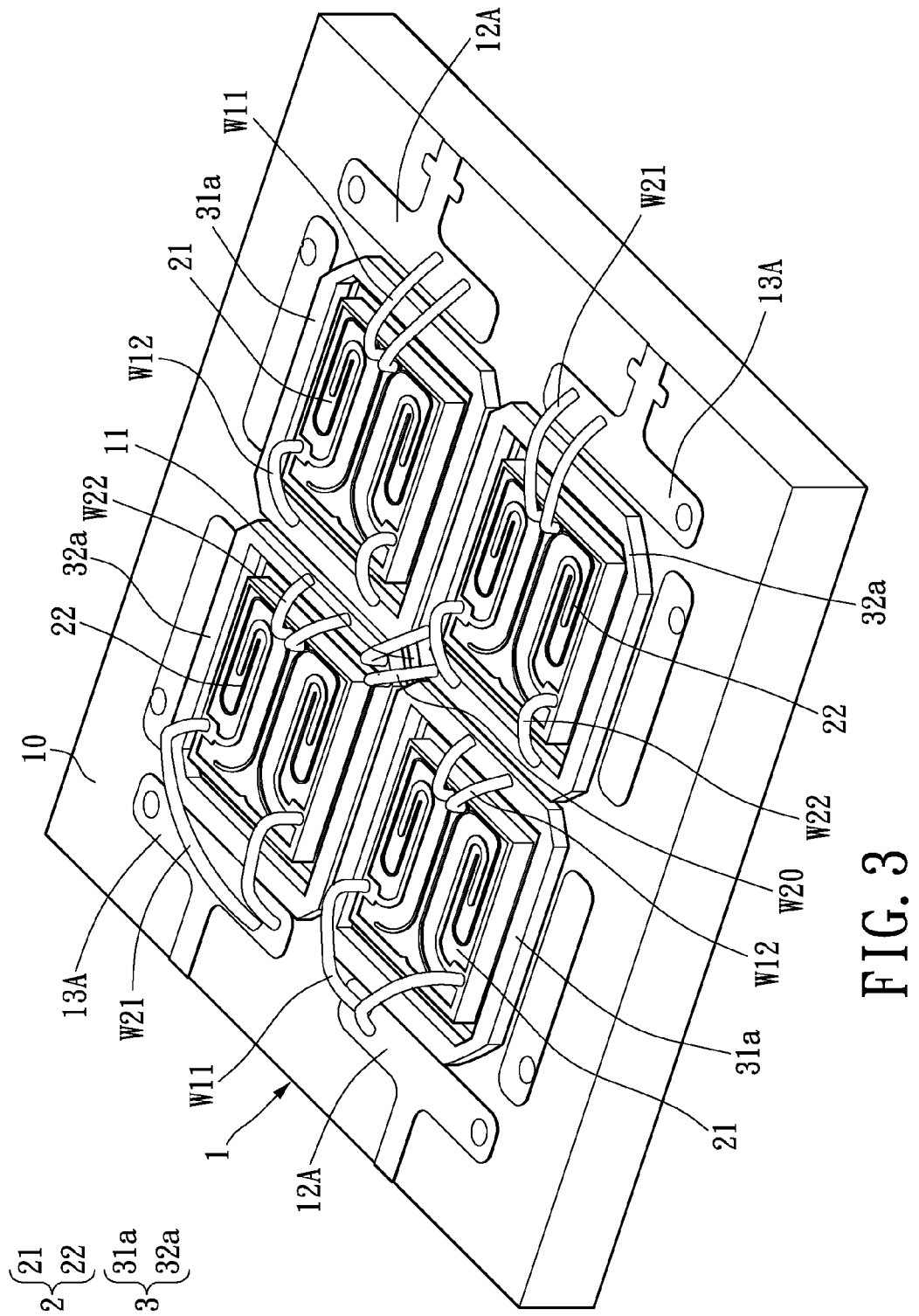
FIG. 3 shows a perspective, schematic view of the light-emitting unit electrically connected between the substrate unit and the frame unit according to the first embodiment of the instant disclosure.

Moreover, referring to FIG. 1A, FIG. 2 and FIG. 3, the light-emitting unit 2 includes at least two first light-emitting elements 21 diagonally disposed on the substrate body 10 and electrically connected to the substrate body 10 and at least two second light-emitting elements 22 diagonally disposed on the substrate body 10 and electrically connected to the substrate body 10 (i.e., the at least two first light-emitting elements 21 and the at least two second light-emitting elements 22 are arranged as a cross-diagonal matrix), where the at least two first light-emitting elements 21 can be electrically connected between the at least two first top conductive pads 12A, and the at least two second light-emitting elements 22 can be electrically connected between the at least two second top conductive pads 13A. In addition, the frame unit 3 includes at least two first conductive frames 31a diagonally disposed on the substrate body 10 to respectively surround the at least two first light-emitting elements 21 and at least two second conductive frames 32a diagonally disposed on the substrate body 10 to respectively surround the at least two second light-emitting elements 22 (i.e., the at least two first conductive frames 31a and the at least two second conductive frames 32a are arranged as a cross-diagonal matrix), wherein the at least two first conductive frames 31a can be electrically connected with each other through the at least one bridging conductive layer 11 (as shown in FIG. 2), and the at least two second conductive frames 32a can be electrically connected with each other through at least one bridging conductive wire W20 (as shown in FIG. 3). Of course, each first conductive frame 31a and each second conductive frame 32a can be continuous frames or discontinuous frames according to different requirements.

For example, the at least two first light-emitting elements 21 and the at least two second light-emitting elements 22 can be symmetrically arranged in a matrix, and the at least two first conductive frames 31a and the at least two second conductive frames 32a can be symmetrically arranged in a matrix. In addition, the at least two first light-emitting elements 21 can be respectively disposed on the at least two first chip-mounting areas A1 of the substrate body 10, and the at least two second light-emitting elements 22 can be respectively disposed on the at least two second chip-mounting areas A2 of the substrate body 10. Moreover, each first light-emitting element 21 has at least two first electrodes 210 disposed on the top surface thereof and respectively electrically connected to the corresponding first top conductive pad 12A and the corresponding first conductive frame 31a, and each second light-emitting element 22 has at least two second electrodes 220 disposed on the top surface thereof and respectively electrically connected to the corresponding second top conductive pad 13A and the corresponding second conductive frame 32a. Furthermore, the at least one bridging conductive wire W20 can correspond to the at least one bridging conductive layer 11 and disposed astride the at least one bridging conductive layer 11.

Hence, when the at least two first light-emitting elements 21 are respectively electrically connected to the at least two first top conductive pads 12A through at least two first outer conductive wires W11, and the at least two first light-emitting elements 21 are respectively electrically connected to the at least two first conductive frames 31a through at least two first inner conductive wires W12, the at least two first electrodes 210 of each first light-emitting element 21 are respectively electrically connected to the corresponding first top conductive pad 12A and the corresponding first conductive frame 31a through the corresponding first outer conductive wire W11 and the corresponding first inner conductive wire W12. In addition, when the at least two second light-emitting elements 22 are respectively electrically connected to the at least two second top conductive pads 13A through at least two second outer conductive wires W21, and the at least two second light-emitting elements 22 are respectively electrically connected to the at least two second conductive frames 32a through at least two second inner conductive wires W22, the at least two second electrodes 220 of each second light-emitting element 22 are respectively electrically connected to the corresponding second top conductive pad 13A and the corresponding second conductive frame 32a through the corresponding second outer conductive wire W21 and the corresponding second inner conductive wire W22. However, the above-mentioned design for the light-emitting unit 2 and the frame unit 3 of the first embodiment is merely an example and is not meant to limit the instant disclosure.

Figure 4:
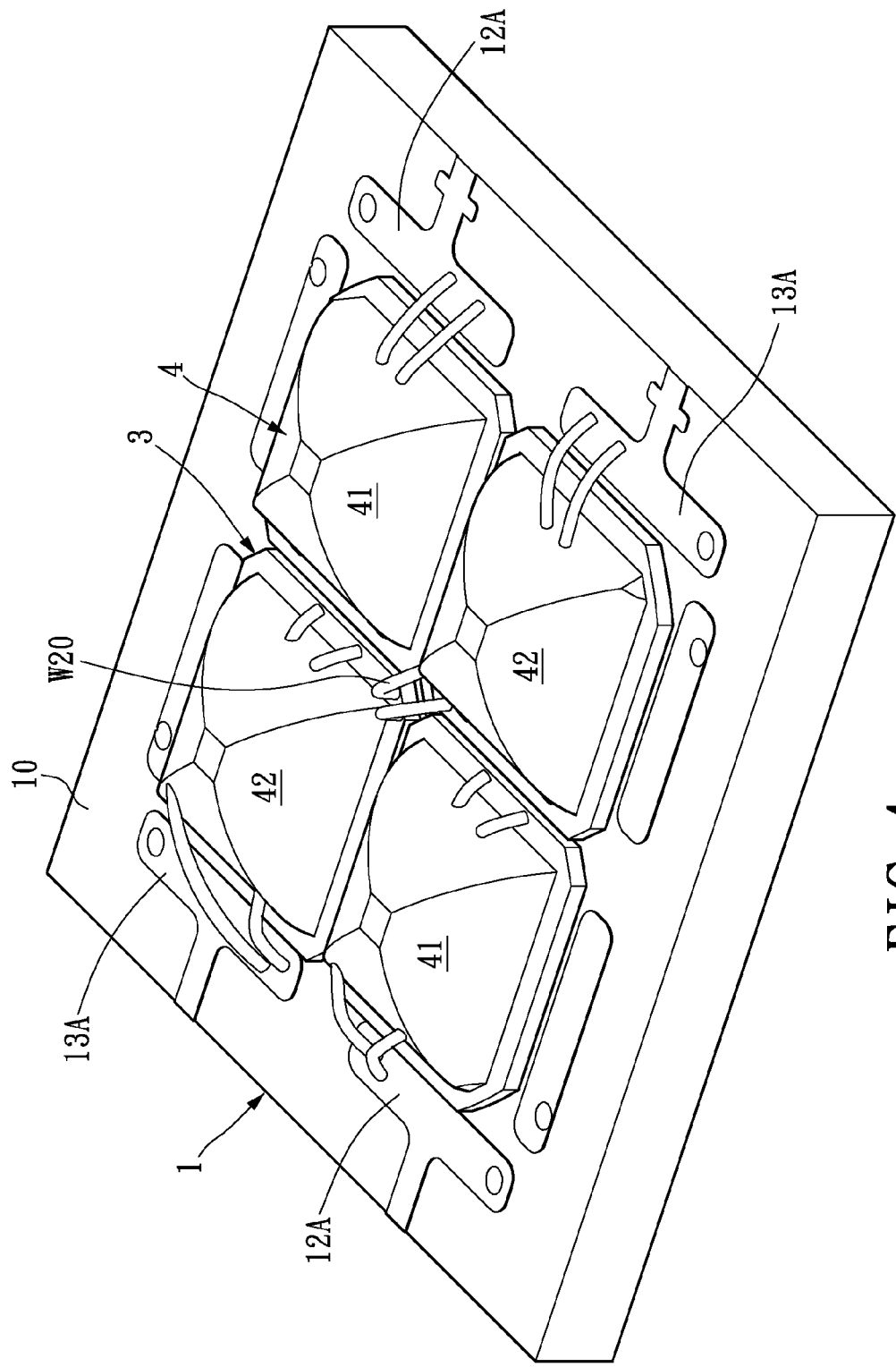
FIG. 4 shows a perspective, schematic view of the package unit disposed on the substrate unit to cover the light-emitting unit according to the first embodiment of the instant disclosure.

Furthermore, referring to FIG. 3 and FIG. 4, the package unit 4 includes at least two first light-transmitting package bodies 41 respectively covering the at least two first light-emitting elements 21 and at least two second light-transmitting package bodies 42 respectively covering the at least two second light-emitting elements 22. The at least two first light-transmitting package bodies 41 are respectively surrounded by the at least two first conductive frames 31a, and the at least two second light-transmitting package bodies 42 are respectively surrounded by the at least two second conductive frames 32a. For example, each first light-transmitting package body 41 may be one of phosphor resin body and transparent resin body, and each second light-transmitting package body 42 may be one of phosphor resin body and transparent resin body. When each first light-emitting element 21 may be a blue light-emitting diode and each first light-transmitting package body 41 may be phosphor resin body for covering the corresponding first light-emitting element 21, blue light beams generated by each first light-emitting element 21 can be transformed into white light beams through the corresponding first light-transmitting package body 41. When each second light-emitting element 22 may be a blue light-emitting diode and each second light-transmitting package body 42 may be transparent resin body for covering the corresponding second light-emitting element 22, blue light beams generated by each second light-emitting element 22 can directly pass through the corresponding second light-transmitting package body 42.

Figure 5:
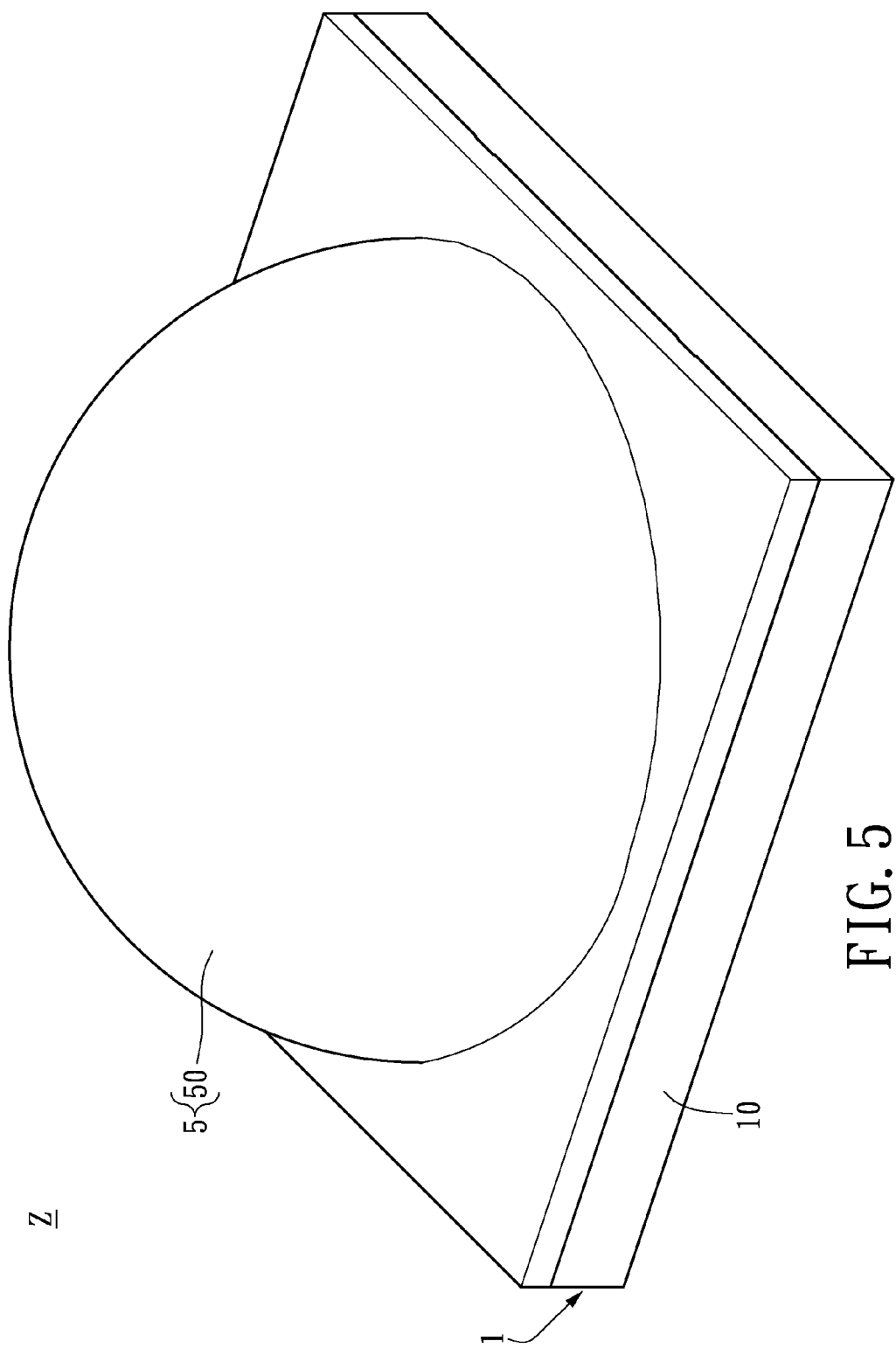
FIG. 5 shows a perspective, schematic view of the lens unit disposed on the substrate unit to cover the package unit according to the first embodiment of the instant disclosure.

Finally, referring to FIG. 4 and FIG. 5, the lens unit 5 includes a lens resin body 50 disposed on the substrate body 10 to enclose the frame unit 3 and the package unit 4. For example, the lens resin body 50 may be a transparent resin body having a light-concentrating function. However, the above-mentioned design for the lens unit 5 of the first embodiment is merely an example and is not meant to limit the instant disclosure. Furthermore, there are three methods for lighting up the light-emitting unit 2 as follows: (1) if the at least two first light-emitting elements 21 are lighted up only, the light beams generated by each first light-emitting elements 21 can sequentially pass through the corresponding first light-transmitting package body 41 and the lens resin body 50 to generate a first-type symmetrical and uniform light-blending source; (2) if the at least two second light-emitting elements 22 are lighted up only, the light beams generated by each second light-emitting elements 22 can sequentially pass through the corresponding second light-transmitting package body 42 and the lens resin body 50 to generate a second-type symmetrical and uniform light-blending source; and (3) if the at least two first light-emitting elements 21 and the at least two second light-emitting elements 22 are lighted up concurrently, the light beams generated by each first light-emitting elements 21 can sequentially pass through the corresponding first light-transmitting package body 41 and the lens resin body 50 and the light beams generated by each second light-emitting elements 22 can sequentially pass through the corresponding second light-transmitting package body 42 and the lens resin body 50, to generate a third-type symmetrical and uniform light-blending source.

[Second Embodiment]

Referring to FIG. 6A to FIG. 9, where the second embodiment of the instant disclosure provides a multichip package structure Z for generating a symmetrical and uniform light-blending source (i.e., the light-mixing source or the quasioptical source), comprising: a substrate unit 1, a light-emitting unit 2, a frame unit 3 and a package unit 4.

Figure 6A:
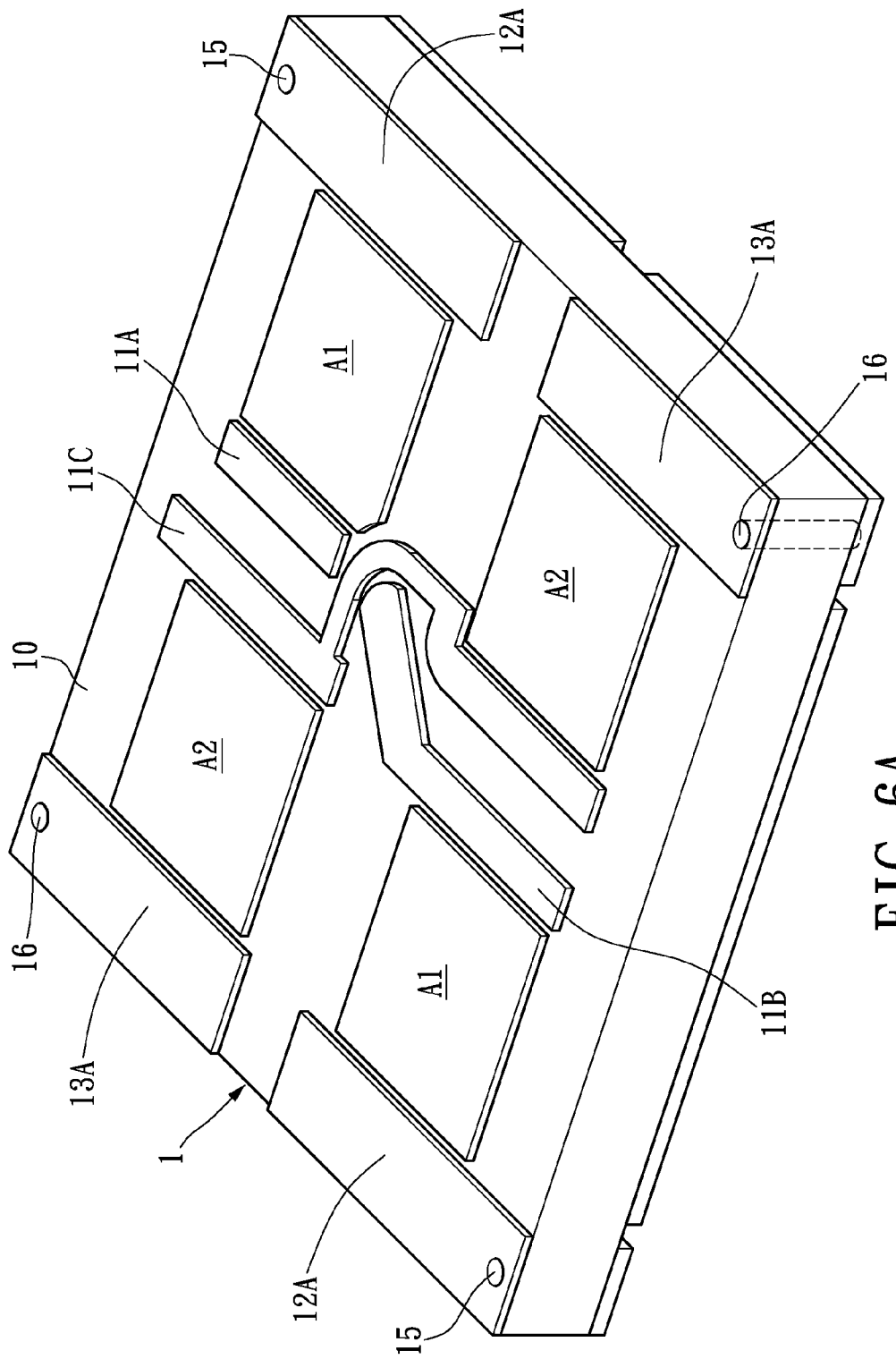
FIG. 6A shows a perspective, schematic view of the substrate unit according to the second embodiment of the instant disclosure.
Figure 6B:
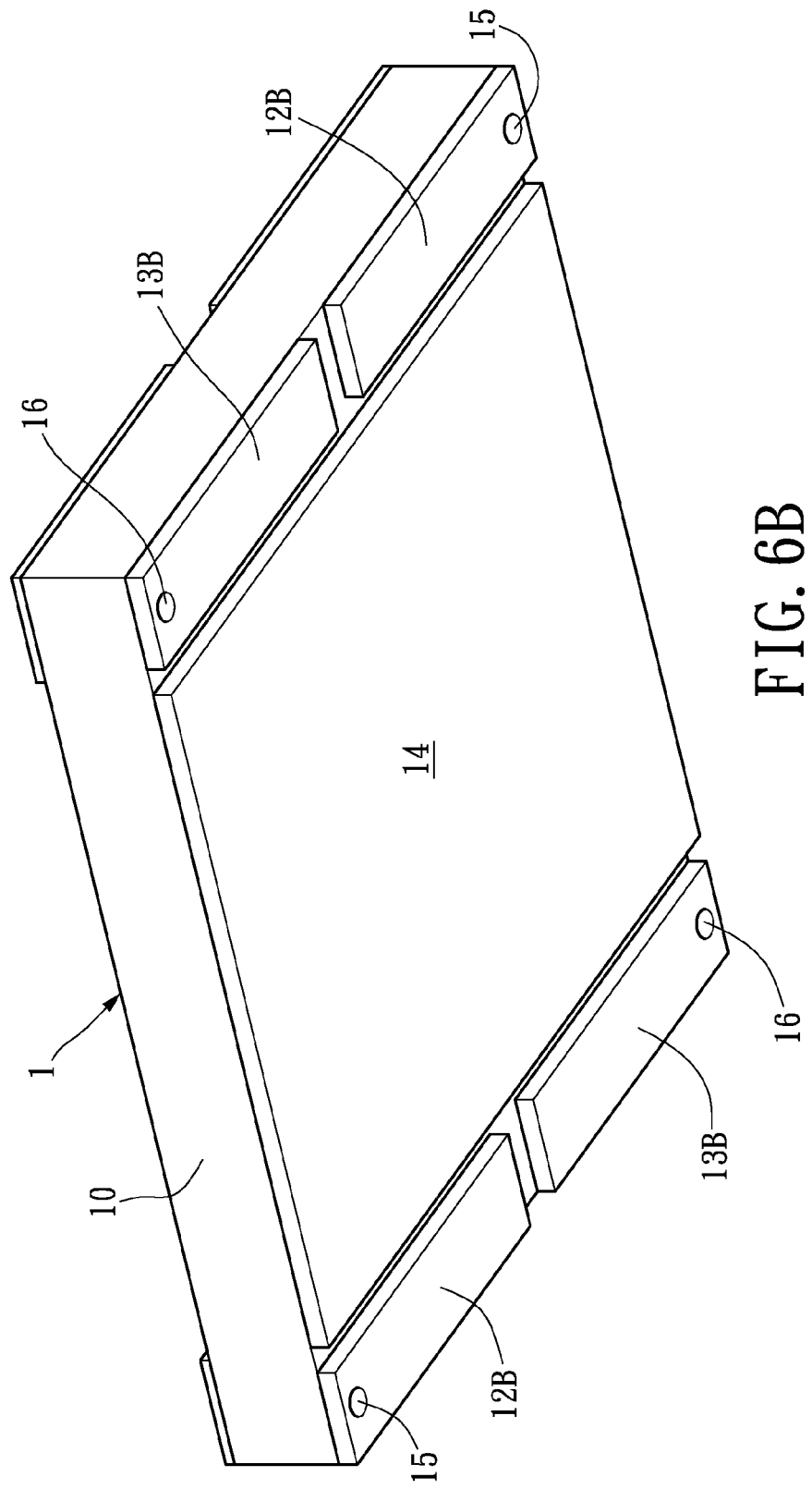
FIG. 6B shows another perspective, schematic view of the substrate unit according to the second embodiment of the instant disclosure.

First, referring to FIG. 6A and FIG. 6B, the substrate unit 1 includes a substrate body 10, at least two bridging conductive layers (11A, 11B) disposed on the top surface of the substrate body 10 and electrically connected with each other, and at least one connecting conductive layer 11C disposed on the top surface of the substrate body 10 and insulated from the at least two bridging conductive layers (11A, 11B). For example, the substrate body 10 has at least two first chip-mounting areas A1 diagonally disposed on the top surface thereof and at least two second chip-mounting areas A2 diagonally disposed on the top surface thereof (i.e., the at least two first chip-mounting areas A1 and the at least two second chip-mounting areas A2 are arranged as a cross-diagonal matrix). The substrate unit 1 includes at least two first top conductive pads 12A diagonally disposed on the top surface of the substrate body 10 and at least two second top conductive pads 13A diagonally disposed on the top surface of the substrate body 10 (i.e., the at least two first top conductive pads 12A and the at least two second top conductive pads 13A are arranged as a cross-diagonal matrix).

For another example, the substrate unit 1 includes at least one heat-dissipating layer 14 disposed on the bottom surface of the substrate body 10 and corresponding to the light-emitting unit 2, at least two first bottom conductive pads 12B disposed on the bottom surface of the substrate body 10 and respectively electrically connected to the at least two first top conductive pads 12A, and at least two second bottom conductive pads 13B disposed on the bottom surface of the substrate body 10 and respectively electrically connected to the at least two second top conductive pads 13A.

For yet another example, the substrate unit 1 includes at least two first conductive bodies 15 passing through the substrate body 10 and at least two second conductive bodies 16 passing through the substrate body 10, where each first conductive body 15 can be electrically connected between the corresponding first top conductive pad 12A and the corresponding first bottom conductive pad 12B, and each second conductive body 16 can be electrically connected between the corresponding second top conductive pad 13A and the corresponding second bottom conductive pad 13B. In other words, the first top conductive pad 12A and the first bottom conductive pad 12B can be electrically connected with each other through the corresponding first conductive body 15, and the second top conductive pad 13A and the second bottom conductive pad 13B can be electrically connected with each other through the corresponding second conductive body 16. However, the above-mentioned design for the substrate unit 1 of the second embodiment is merely an example and is not meant to limit the instant disclosure.

Figure 7:
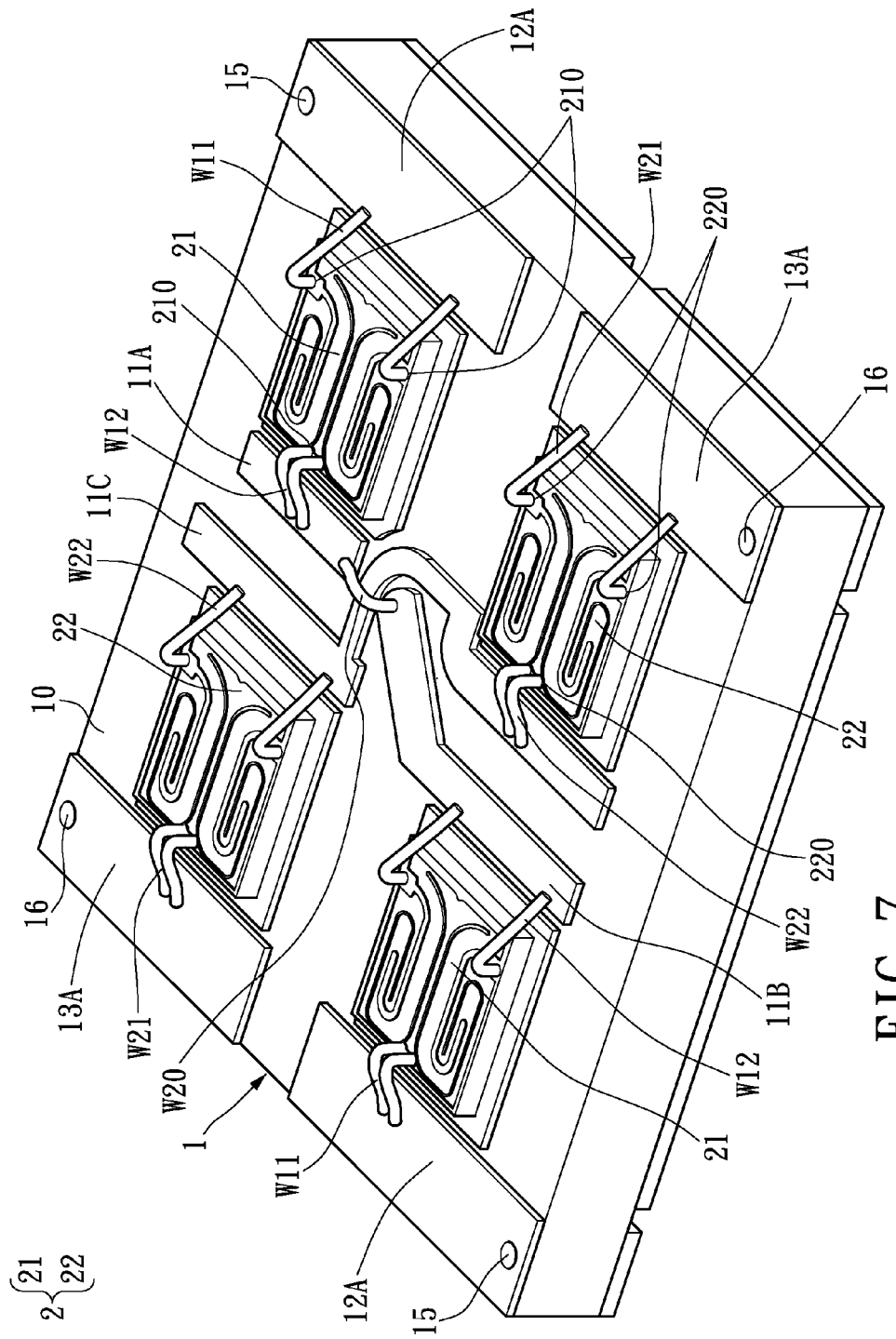
FIG. 7 shows a perspective, schematic view of the light-emitting unit disposed on the substrate unit according to the second embodiment of the instant disclosure.

Moreover, referring to FIG. 6A and FIG. 7, the light-emitting unit 2 includes at least two first light-emitting elements 21 diagonally disposed on the substrate body 10 and electrically connected to the substrate body 10 and at least two second light-emitting elements 22 diagonally disposed on the substrate body 10 and electrically connected to the substrate body 10 (i.e., the at least two first light-emitting elements 21 and the at least two second light-emitting elements 22 are arranged as a cross-diagonal matrix), where the at least two bridging conductive layers (11A, 11B) are electrically connected between the at least two first light-emitting elements 21, and the at least one connecting conductive layer 11C is electrically connected between the at least two second light-emitting elements 22. In addition, the at least two first light-emitting elements 21 can be electrically connected between the at least two first top conductive pads 12A, and the at least two second light-emitting elements 22 can be electrically connected between the at least two second top conductive pads 13A.

For example, the at least two first light-emitting elements 21 and the at least two second light-emitting elements 22 can be symmetrically arranged in a matrix (as shown in FIG. 7). In addition, the at least two first light-emitting elements 21 can be respectively disposed on the at least two first chip-mounting areas A1 of the substrate body 10, and the at least two second light-emitting elements 22 can be respectively disposed on the at least two second chip-mounting areas A2 of the substrate body 10. Moreover, each first light-emitting element 21 has at least two first electrodes 210 disposed on the top surface thereof and respectively electrically connected to the corresponding first top conductive pad 12A and the corresponding bridging conductive layer 11A, and each second light-emitting element 22 has at least two second electrodes 220 disposed on the top surface thereof and respectively electrically connected to the corresponding second top conductive pad 13A and the at least one connecting conductive layer 11C.

Hence, when the at least two first light-emitting elements 21 are respectively electrically connected to the at least two first top conductive pads 12A through at least two first outer conductive wires W11, and the at least two first light-emitting elements 21 are respectively electrically connected to the at least two bridging conductive layers (11A, 11B) through at least two first inner conductive wires W12, the at least two first electrodes 210 of each first light-emitting element 21 are respectively electrically connected to the corresponding first top conductive pad 12A and the corresponding bridging conductive layer (11A or 11B) through the corresponding first outer conductive wire W11 and the corresponding first inner conductive wire W12. In addition, when the at least two second light-emitting elements 22 are respectively electrically connected to the at least two second top conductive pads 13A through at least two second outer conductive wires W21, and the at least two second light-emitting elements 22 are respectively electrically connected to two opposite end portions of the at least one connecting conductive layer 11C through at least two second inner conductive wires W22, the at least two second electrodes 220 of each second light-emitting element 22 are respectively electrically connected to the corresponding second top conductive pad 13A and the at least one connecting conductive layer 11C through the corresponding second outer conductive wire W21 and the corresponding second inner conductive wire W22. In addition, the at least two bridging conductive layers (11A, 11B) can be electrically connected with each other through at least one bridging conductive wire W20. However, the above-mentioned design for the light-emitting unit 2 of the second embodiment is merely an example and is not meant to limit the instant disclosure.

Moreover, the frame unit 3 includes at least two first insulative frames 31b diagonally disposed on the substrate body 10 to respectively surround the at least two first light-emitting elements 21 and at least two second insulative frames 32b diagonally disposed on the substrate body 10 to respectively surround the at least two second light-emitting elements 22 (i.e., the at least two first insulative frames 31b and the at least two second insulative frames 32b are arranged as a cross-diagonal matrix), wherein the at least two first insulative frames 31b and the at least two second insulative frames 32b can be integrated with each other to form a single frame component. For example, the at least two first insulative frames 31b and the at least two second insulative frames 32b can be symmetrically arranged in a matrix. Furthermore, each first insulative frame 31b has a first receiving groove 310b for receiving the corresponding first outer conductive wire W11, the corresponding first inner conductive wire W12 and the corresponding first light-transmitting package body 41. Each second insulative frame 32b has a second receiving groove 320b for receiving the corresponding second outer conductive wire W21, the corresponding second inner conductive wire W22 and the corresponding second light-transmitting package body 42. The at least one bridging conductive wire W20 is received in the first receiving groove 310b of one of the at least two first insulative frames 31b. Of course, each first insulative frame 31b and each second insulative frame 32b can be continuous frames or discontinuous frames according to different requirements.

Figure 8:
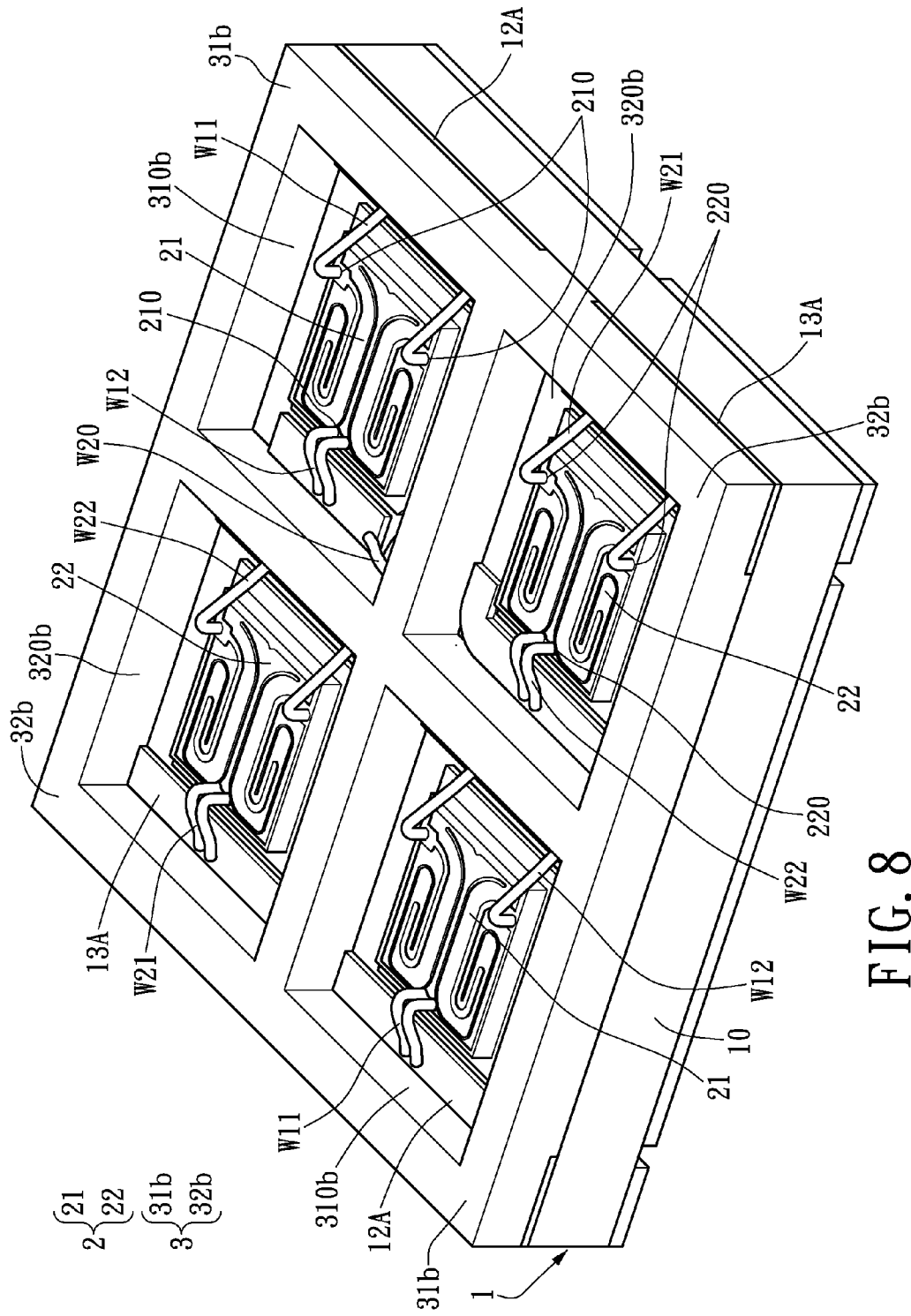
FIG. 8 shows a perspective, schematic view of the frame unit disposed on the substrate unit to surround the light-emitting unit according to the second embodiment of the instant disclosure.
Figure 9:
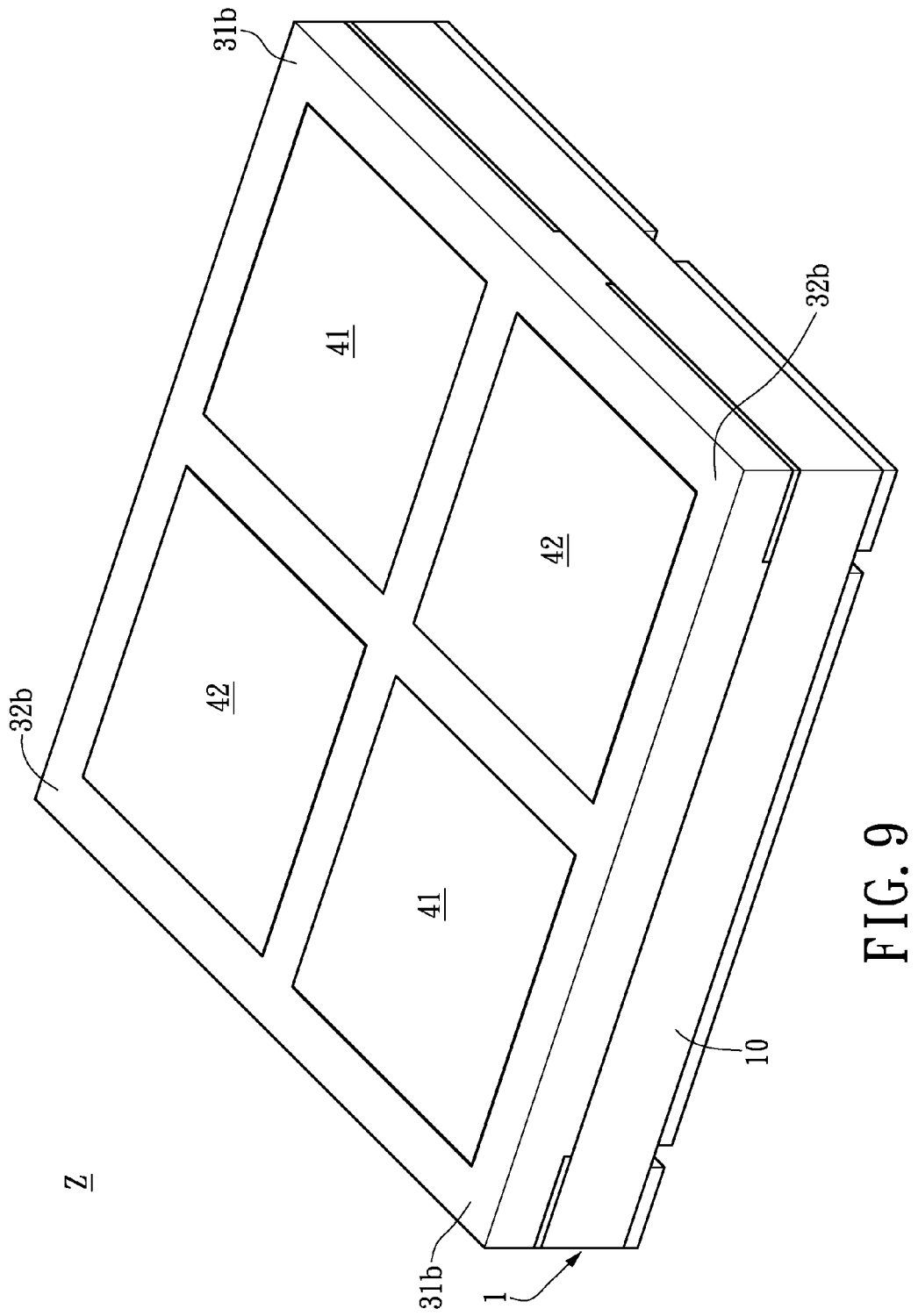
FIG. 9 shows a perspective, schematic view of the package unit disposed on the substrate unit to cover the light-emitting unit according to the second embodiment of the instant disclosure.

Furthermore, referring to FIG. 8 and FIG. 9, the package unit 4 includes at least two first light-transmitting package bodies 41 respectively covering the at least two first light-emitting elements 21 and at least two second light-transmitting package bodies 42 respectively covering the at least two second light-emitting elements 22. The at least two first light-transmitting package bodies 41 are respectively surrounded by the at least two first insulative frames 31b, and the at least two second light-transmitting package bodies 42 are respectively surrounded by the at least two second insulative frames 32b. For example, each first light-transmitting package body 41 may be one of phosphor resin body and transparent resin body, and each second light-transmitting package body 42 may be one of phosphor resin body and transparent resin body. When each first light-emitting element 21 may be a blue light-emitting diode and each first light-transmitting package body 41 may be phosphor resin body for covering the corresponding first light-emitting element 21, blue light beams generated by each first light-emitting element 21 can be transformed into white light beams through the corresponding first light-transmitting package body 41. When each second light-emitting element 22 may be a blue light-emitting diode and each second light-transmitting package body 42 may be transparent resin body for covering the corresponding second light-emitting element 22, blue light beams generated by each second light-emitting element 22 can directly pass through the corresponding second light-transmitting package body 42.

[Third Embodiment]

Referring to FIG. 10A to FIG. 14, where the third embodiment of the instant disclosure provides a multichip package structure Z for generating a symmetrical and uniform light-blending source, comprising: a substrate unit 1, a light-emitting unit 2, a frame unit 3 and a package unit 4.

The substrate unit 1 includes a substrate body 10. The light-emitting unit 2 includes at least two first light-emitting elements 21 diagonally disposed on the substrate body 10 along a first diagonal line (not shown) and electrically connected to the substrate body 10 and at least two second light-emitting elements 22 diagonally disposed on the substrate body 10 along a second diagonal line (not shown) and electrically connected to the substrate body 10, and the first diagonal line crosses the second diagonal line to form a crisscross shape. The at least two first light-emitting elements 21 are electrically connected with each other in series, and the at least two second light-emitting elements 22 are electrically connected with each other in series. The package unit 4 includes at least two first light-transmitting package bodies 41 respectively enclosing the at least two first light-emitting elements 21 and at least two second light-transmitting package bodies 42 respectively enclosing the at least two second light-emitting elements 22.

Figure 10A:
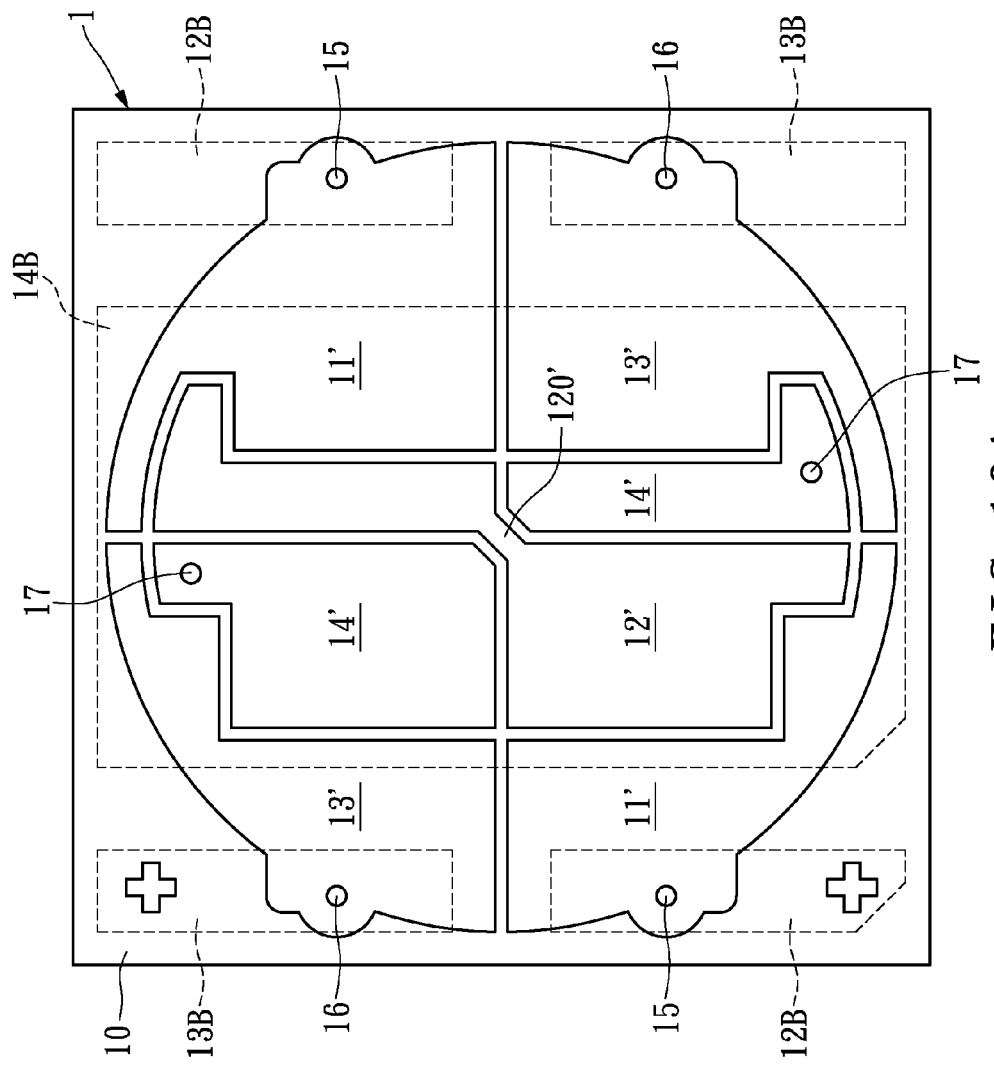
FIG. 10A shows a top, schematic view of the substrate unit according to the third embodiment of the instant disclosure.
Figure 10B:
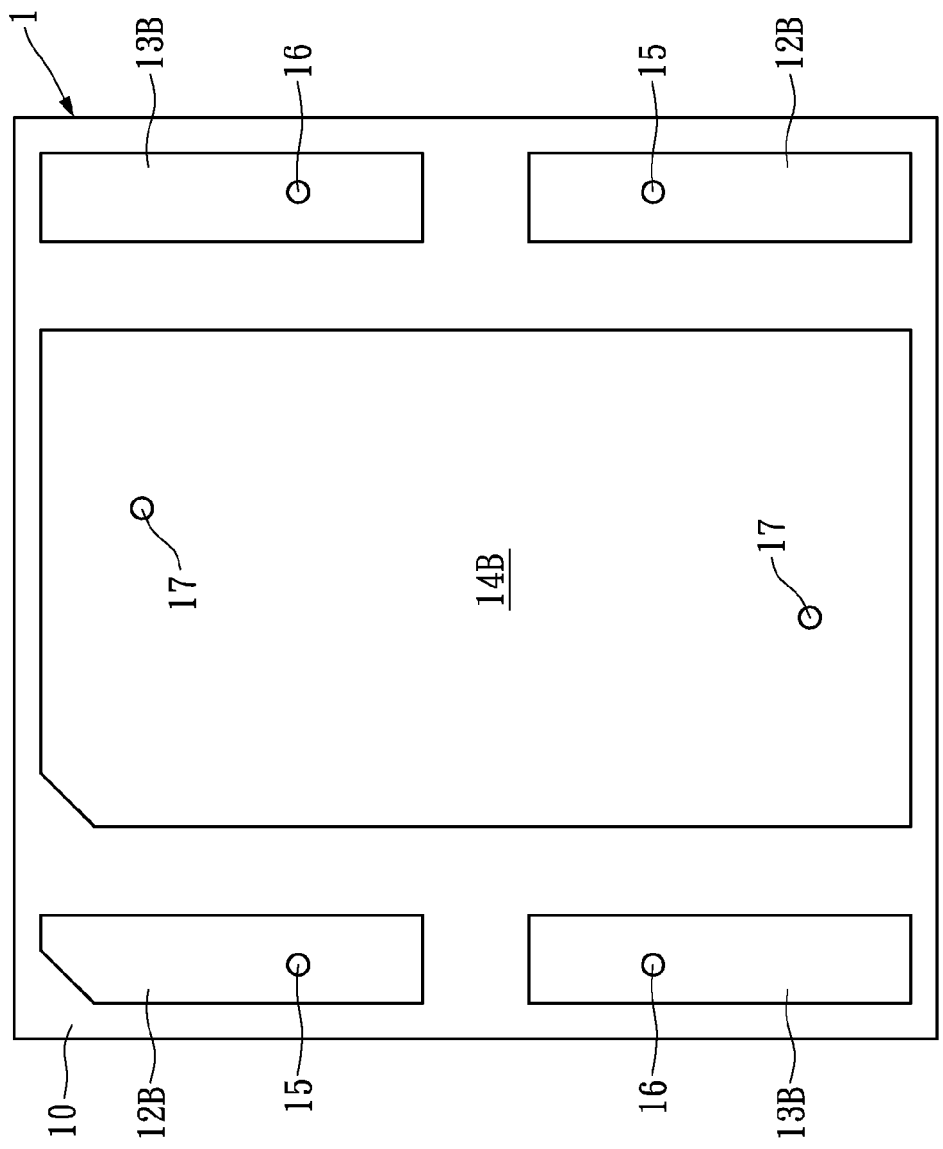
FIG. 10B shows a bottom, schematic view of the substrate unit according to the third embodiment of the instant disclosure.

Referring to FIG. 10A and FIG. 10B, the substrate unit 1 includes at least two first outer conductive pads 11' diagonally disposed on the top surface of the substrate body 10, at least one first inner conductive pad 12' disposed between the at least two first outer conductive pads 11', at least two second outer conductive pads 13' diagonally disposed on the top surface of the substrate body 10, and at least two second inner conductive pads 14' diagonally disposed between the at least two second outer conductive pads 13'. More precisely, the substrate unit 1 includes at least two first bottom conductive pads 12B diagonally disposed on the bottom surface of the substrate body 10 and respectively electrically connected to the at least two first outer conductive pads 11', at least two second bottom conductive pads 13B diagonally disposed on the bottom surface of the substrate body 10 and respectively electrically connected to the at least two second outer conductive pads 13', and a third bottom conductive pad 14B disposed on the bottom surface of the substrate body 10, between the at least two first bottom conductive pads 12B and between at least two second bottom conductive pads 13B.

Moreover, the substrate unit 1 includes at least two first conductive bodies 15 passing through the substrate body 10 to electrically contact the at least two first outer conductive pads 11' and the at least two first bottom conductive pads 12B, at least two second conductive bodies 16 passing through the substrate body 10 to electrically contact the at least two second outer conductive pads 13' and the at least two second bottom conductive pads 13B, and at least two third conductive bodies 17 passing through the substrate body 10 to electrically contact the at least two second inner conductive pads 14' and the at least one third bottom conductive pad 14B. More precisely, each first conductive body 15 is electrically connected between the corresponding first outer conductive pad 11' and the corresponding first bottom conductive pad 12B, each second conductive body 16 is electrically connected between the corresponding second outer conductive pad 13' and the corresponding second bottom conductive pad 13B, and each third conductive body 17 is electrically connected between the corresponding second inner conductive pad 14' and the at least one third bottom conductive pad 14B.

Figure 11:
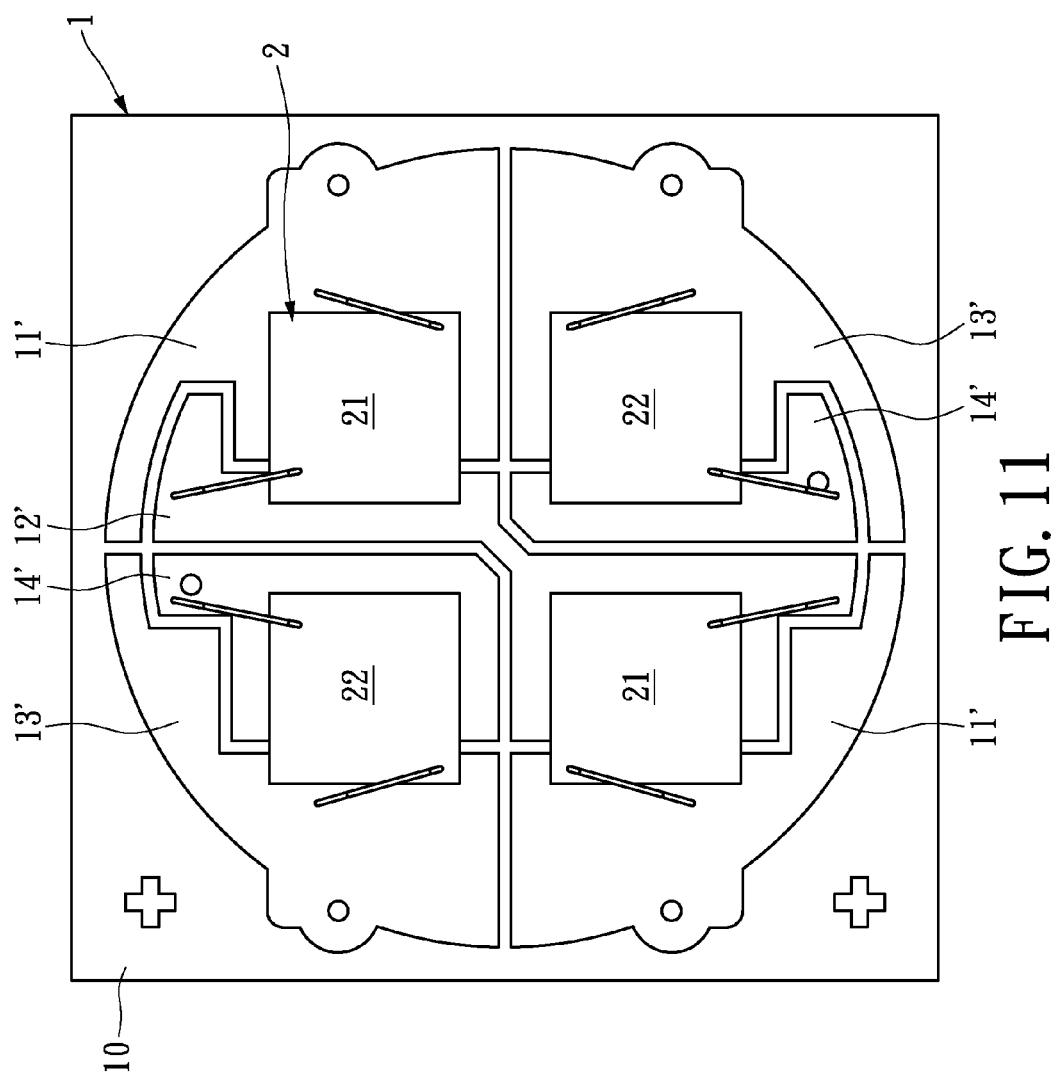
FIG. 11 shows a top, schematic view of the light-emitting unit disposed on the substrate unit according to the third embodiment of the instant disclosure.
Figure 12:
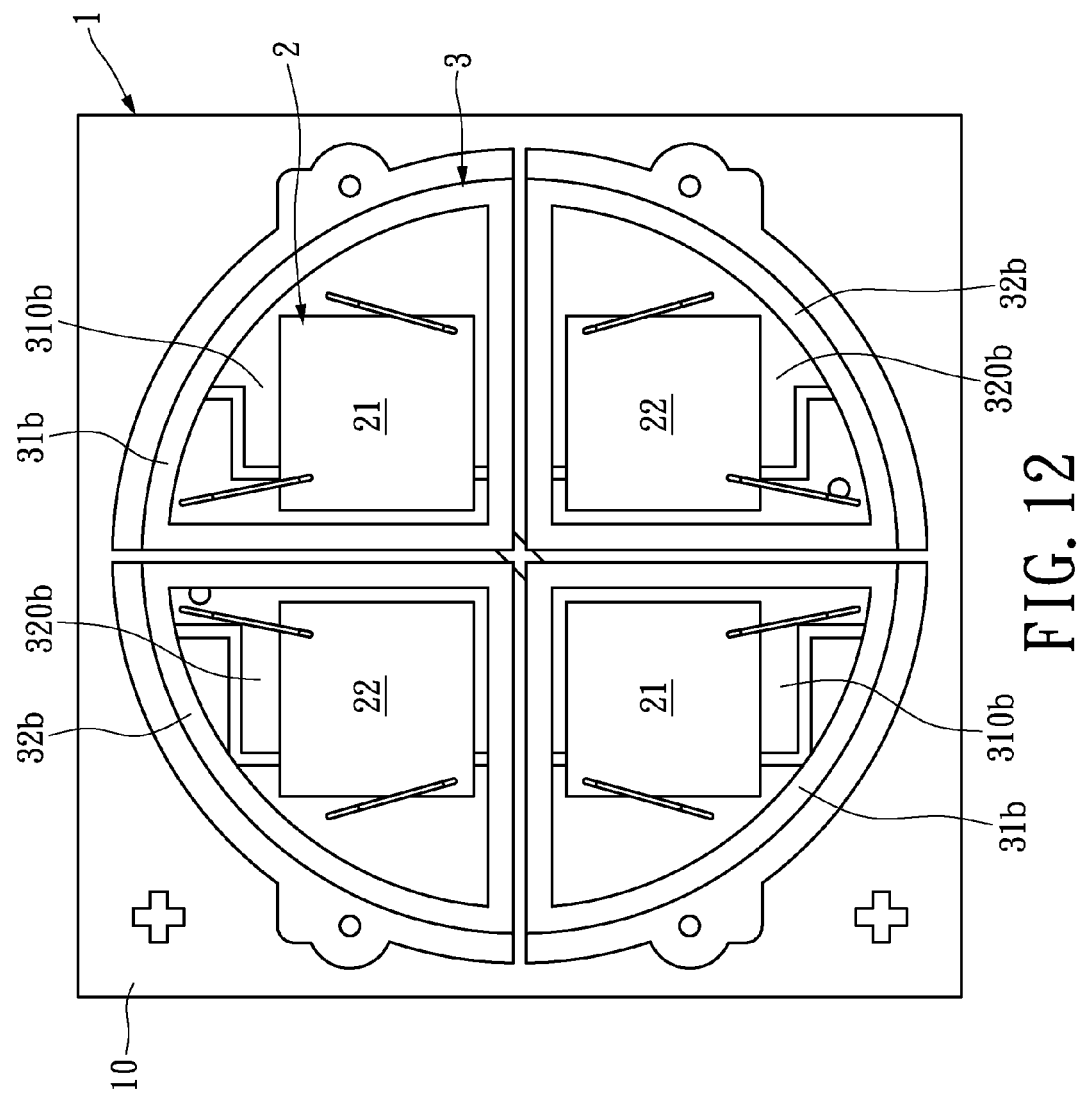
FIG. 12 shows a top, schematic view of the frame unit disposed on the substrate unit to surround the light-emitting unit according to the third embodiment of the instant disclosure.

Referring to FIG. 10A and FIG. 11, one of the at least two first light-emitting elements 21 is electrically connected between one of the at least two first outer conductive pads 11' and the at least one first inner conductive pad 12' by wire bonding (the same to the first and the second embodiments), and the other first light-emitting element 21 is electrically connected between the other first outer conductive pad 11' and the at least one first inner conductive pad 12' by wire bonding. One of the at least two second light-emitting elements 22 is electrically connected between one of the at least two second outer conductive pads 13' and one of the at least two second inner conductive pads 14' by wire bonding, and the other second light-emitting element 22 is electrically connected between the other second outer conductive pads 13' and the other second inner conductive pad 14 by wire bonding. Therefore, the at least two first light-emitting elements 21 can be electrically connected with each other in series through the common first inner conductive pad 12', and the at least two second light-emitting elements 22 can be electrically connected with each other in series through the common third bottom conductive pad 14B.

Figure 13:
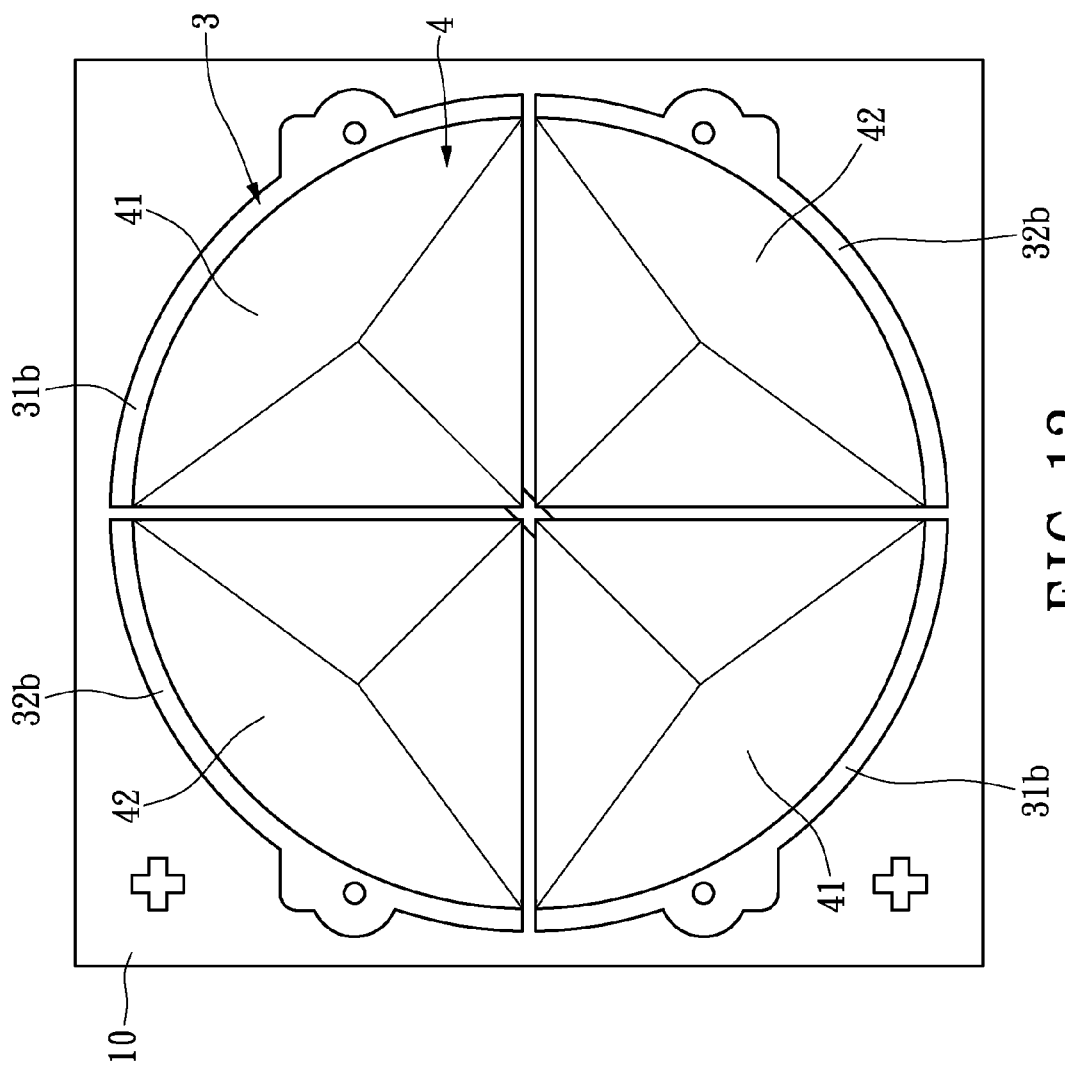
FIG. 13 shows a top, schematic view of the package unit disposed on the substrate unit to cover the light-emitting unit according to the third embodiment of the instant disclosure.

Referring to FIG. 11 and FIG. 13, the frame unit 3 includes at least two first insulative frames 31*b* diagonally disposed on the substrate body 10 to respectively surround the at least two first light-emitting elements 21 and at least two second insulative frames 32*b* diagonally disposed on the substrate body 10 to respectively surround the at least two second light-emitting elements 22. In addition, the at least two first light-transmitting package bodies 41 are respectively surrounded by the at least two first insulative frames 31*b*, and the at least two second light-transmitting package bodies 42 are respectively surrounded by the at least two second insulative frames 32*b*. More precisely, each first insulative frame 31*b* has a first receiving space 310*b* for receiving the corresponding first light-emitting element 21 and the corresponding first light-transmitting package body 41, and each second insulative frame 32*b* has a second receiving space 320*b* for receiving the corresponding second light-emitting element 22 and the corresponding second light-transmitting package body 42.

Figure 14:
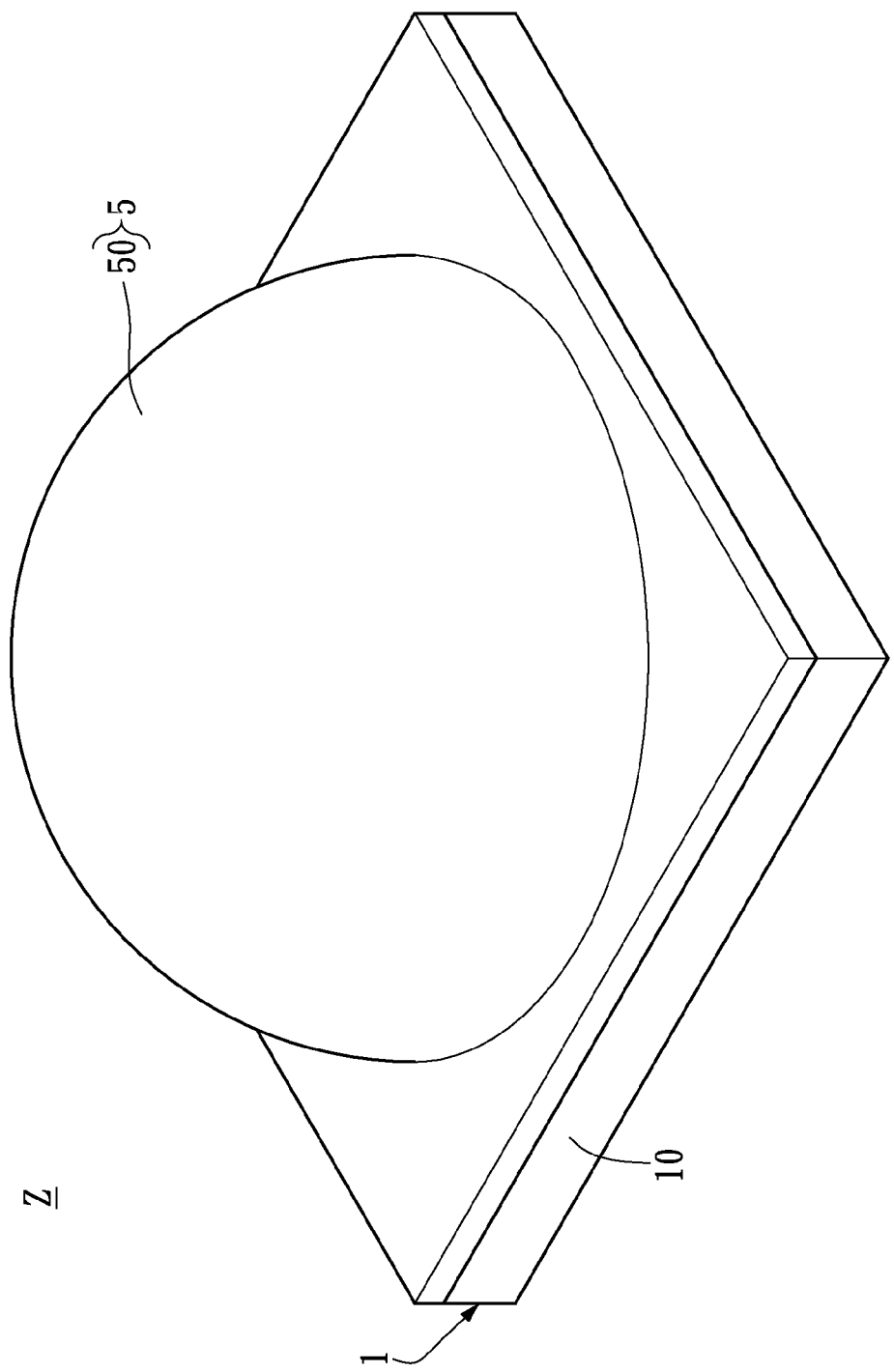
FIG. 14 shows a perspective, schematic view of the lens unit disposed on the substrate unit to cover the package unit according to the first embodiment of the instant disclosure.

Referring to FIG. 13 and FIG. 14, the lens unit 5 includes a lens resin body 50 disposed on the substrate body 10 to enclose the frame unit 3 and the package unit 4. For example, the lens resin body 50 may be a transparent resin body having a light-concentrating function. Furthermore, there are three methods for lighting up the light-emitting unit 2 as follows: (1) if the at least two first light-emitting elements 21 are lighted up only, the light beams generated by each first light-emitting elements 21 can sequentially pass through the corresponding first light-transmitting package body 41 and the lens resin body 50 to generate a first-type symmetrical and uniform light-blending source; (2) if the at least two second light-emitting elements 22 are lighted up only, the light beams generated by each second light-emitting elements 22 can sequentially pass through the corresponding second light-transmitting package body 42 and the lens resin body 50 to generate a second-type symmetrical and uniform light-blending source; and (3) if the at least two first light-emitting elements 21 and the at least two second light-emitting elements 22 are lighted up concurrently, the light beams generated by each first light-emitting elements 21 can sequentially pass through the corresponding first light-transmitting package body 41 and the lens resin body 50 and the light beams generated by each second light-emitting elements 22 can sequentially pass through the corresponding second light-transmitting package body 42 and the lens resin body 50, to generate a third-type symmetrical and uniform light-blending source.

[Fourth Embodiment]

Figure 15:
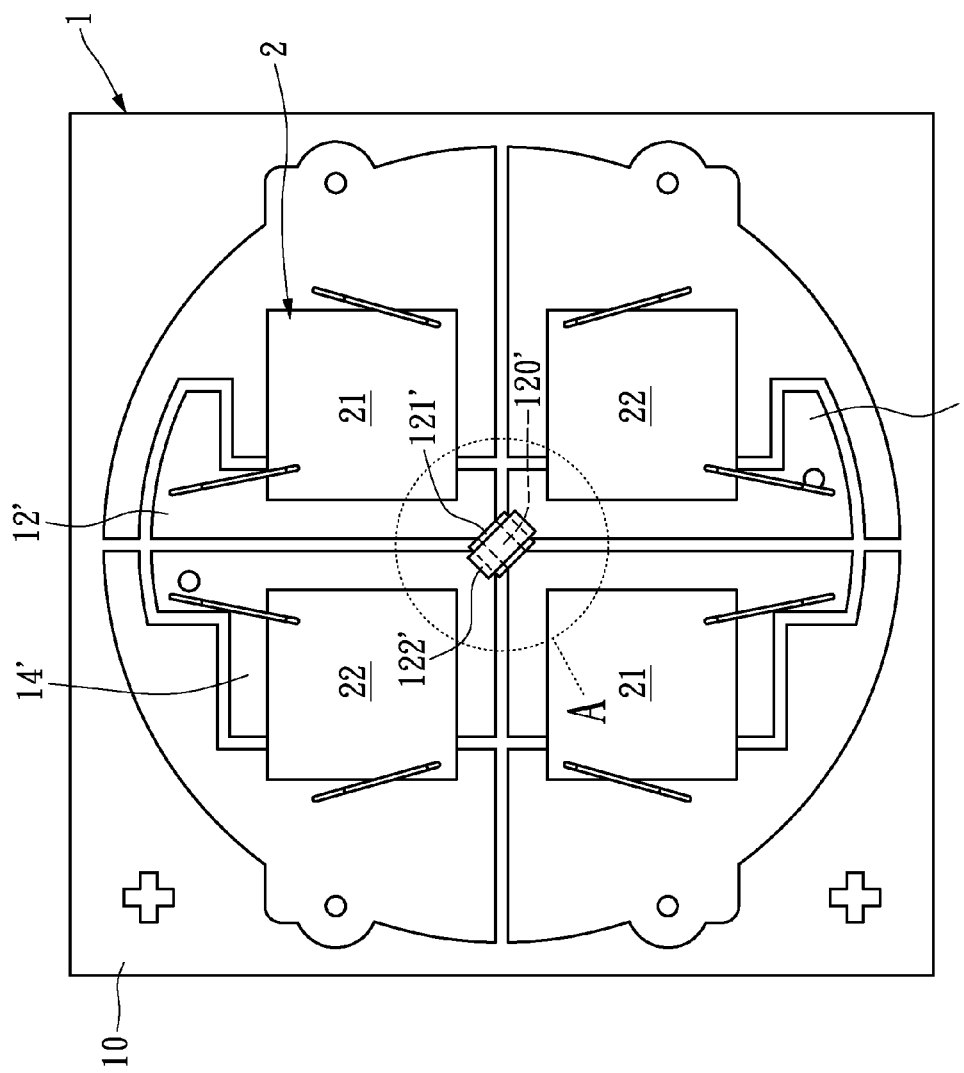
FIG. 15 shows a top, schematic view of the light-emitting unit disposed on the substrate unit according to the fourth embodiment of the instant disclosure.
Figure 16:
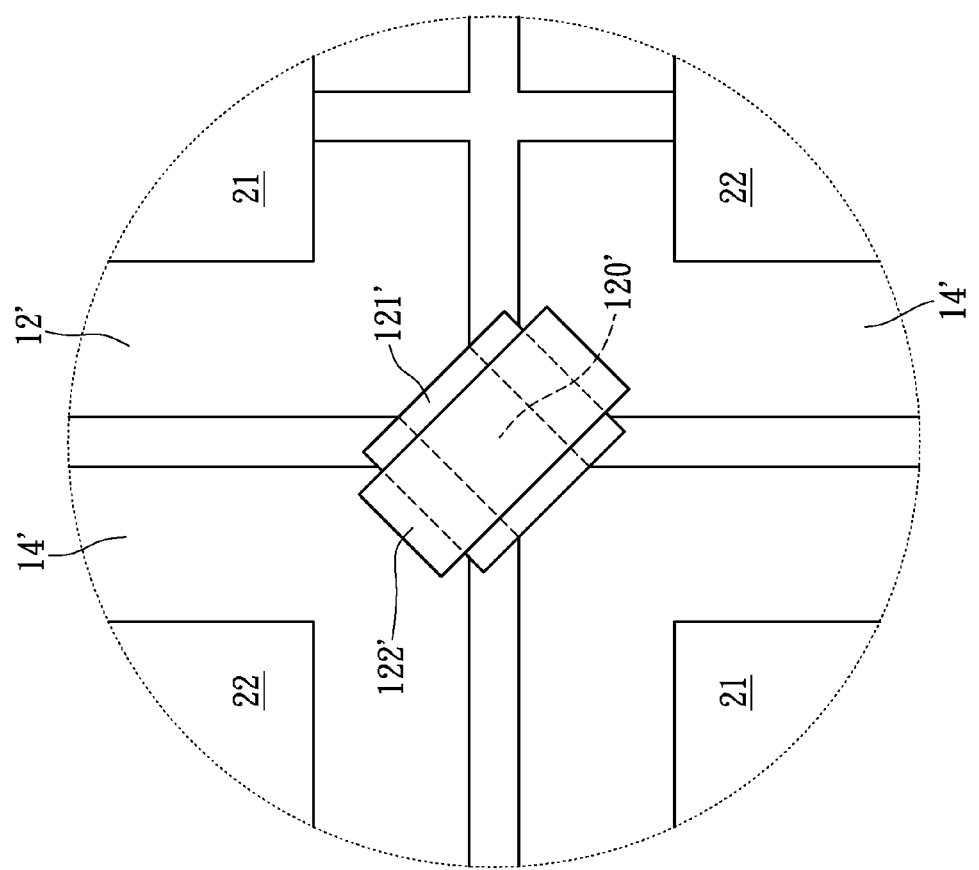
FIG. 16 shows an enlarged view taken on part A of FIG. 15.

Referring to FIG. 15 and FIG. 16, where the fourth embodiment of the instant disclosure provides a multichip package structure Z for generating a symmetrical and uniform light-blending source, comprising: a substrate unit 1, a light-emitting unit 2, a frame unit 3 and a package unit 4. Comparing FIG. 15 and FIG. 11, the difference between the fourth embodiment and the third embodiment is as follows: in the fourth embodiment, the substrate unit 1 includes a bridging insulative layer 121' covering a bridging portion 120' of the at least one first inner conductive pad 12' and disposed between the at least two second inner conductive pads 14' and a bridging conductive layer 122' covering the bridging insulative layer 121' and electrically connected between the at least two second inner conductive pads 14'. Hence, the at least two first light-emitting elements 21 can be electrically connected with each other in series through the common first inner conductive pad 12', and the at least two second light-emitting elements 22 can be electrically connected with each other in series through the bridging conductive layer 122' without using the at least one third bottom conductive pad 14B.

In conclusion, because the at least two first light-emitting elements 21 are diagonally disposed on the substrate body 10 and electrically connected to the substrate body 10 and the at least two second light-emitting elements 22 are diagonally disposed on the substrate body 10 and electrically connected to the substrate body 10, thus the multichip package structure Z can be used to generate a symmetrical and uniform light-blending source.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A multichip package structure for generating a symmetrical and uniform light-blending source, comprising:
   a substrate unit including a substrate body and at least one bridging conductive layer disposed on the top surface of the substrate body;
   a light-emitting unit including at least two first light-emitting elements diagonally disposed on the substrate body and electrically connected to the substrate body and at least two second light-emitting elements diagonally disposed on the substrate body and electrically connected to the substrate body;
   a package unit including at least two first light-transmitting package bodies respectively covering the at least two first light-emitting elements and at least two second light-transmitting package bodies respectively covering the at least two second light-emitting elements; and
   a frame unit including at least two first conductive frames diagonally disposed on the substrate body to respectively surround the at least two first light-emitting elements and at least two second conductive frames diagonally disposed on the substrate body to respectively surround the at least two second light-emitting elements, wherein the at least two first conductive frames are electrically connected with each other through the at least one bridging conductive layer, the at least two second conductive frames are electrically connected with each other through at least one bridging conductive wire, the at least two first light-transmitting package bodies are respectively surrounded by the at least two first conductive frames, and the at least two second light-transmitting package bodies are respectively surrounded by the at least two second conductive frames.

2. The multichip package structure of claim 1 wherein the substrate unit includes at least two first top conductive pads diagonally disposed on the top surface of the substrate body, and the at least two first light-emitting elements are electrically connected between the at least two first top conductive pads, wherein the substrate unit includes at least two second top conductive pads diagonally disposed on the top surface of the substrate body, and the at least two second light-emitting elements are electrically connected between the at least two second top conductive pads.

3. The multichip package structure of claim 2, wherein the substrate unit includes at least one heat-dissipating layer disposed on the bottom surface of the substrate body and corresponding to the light-emitting unit, at least two first bottom conductive pads disposed on the bottom surface of the substrate body and respectively electrically connected to the at least two first top conductive pads, and at least two second bottom conductive pads disposed on the bottom surface of the substrate body and respectively electrically connected to the at least two second top conductive pads.

4. The multichip package structure of claim 3, wherein the substrate unit includes at least two first conductive bodies passing through the substrate body and at least two second conductive bodies passing through the substrate body, each first conductive body is electrically connected between the corresponding first top conductive pad and the corresponding first bottom conductive pad, and each second conductive body is electrically connected between the corresponding second top conductive pad and the corresponding second bottom conductive pad.

5. The multichip package structure of claim 2, wherein the at least two first light-emitting elements are respectively electrically connected to the at least two first top conductive pads through at least two first outer conductive wires, and the at least two first light-emitting elements are respectively electrically connected to the at least two first conductive frames through at least two first inner conductive wires, wherein the at least two second light-emitting elements are respectively electrically connected to the at least two second top conductive pads through at least two second outer conductive wires, and the at least two second light-emitting elements are respectively electrically connected to the at least two second conductive frames through at least two second inner conductive wires.

6. The multichip package structure of claim 2, wherein each first light-emitting element has at least two first electrodes disposed on the top surface thereof and respectively electrically connected to the corresponding first top conductive pad and the corresponding first conductive frame, and each second light-emitting element has at least two second electrodes disposed on the top surface thereof and respectively electrically connected to the corresponding second top conductive pad and the corresponding second conductive frame.

7. The multichip package structure of claim 2, wherein the at least two first light-emitting elements and the at least two second light-emitting elements are symmetrically arranged in a matrix, and the at least two first conductive frames and the at least two second conductive frames are symmetrically arranged in a matrix.

8. The multichip package structure of claim 1, wherein each first light-transmitting package body is one of phosphor resin body and transparent resin body, and each second light-transmitting package body is one of phosphor resin body and transparent resin body.

9. The multichip package structure of claim 1, further comprising:
a lens unit including a lens resin body disposed on the substrate body to enclose the frame unit and the package unit.

10. A multichip package structure for generating a symmetrical and uniform light-blending source, comprising:
a substrate unit including a substrate body, at least two bridging conductive layers disposed on the top surface of the substrate body and electrically connected with each other, and at least one connecting conductive layer disposed on the top surface of the substrate body and insulated from the at least two bridging conductive layers;
a light-emitting unit including at least two first light-emitting elements diagonally disposed on the substrate body and electrically connected to the substrate body and at least two second light-emitting elements diagonally disposed on the substrate body and electrically connected to the substrate body, wherein the at least two bridging conductive layers are electrically connected between the at least two first light-emitting elements, and the at least one connecting conductive layer is electrically connected between the at least two second light-emitting elements; and a package unit including at least two first light-transmitting package bodies respectively covering the at least two first light-emitting elements and at least two second light-transmitting package bodies respectively covering the at least two second light-emitting elements.

11. The multichip package structure of claim 10, further comprising: a frame unit including at least two first insulative frames diagonally disposed on the substrate body to respectively surround the at least two first light-emitting elements and at least two second insulative frames diagonally disposed on the substrate body to respectively surround the at least two second light-emitting elements, wherein the at least two first insulative frames and the at least two second insulative frames are integrated with each other to form a single frame component, the at least two first light-transmitting package bodies are respectively surrounded by the at least two first insulative frames, and the at least two second light-transmitting package bodies are respectively surrounded by the at least two second insulative frames.

12. The multichip package structure of claim 11, wherein the substrate unit includes at least two first top conductive pads diagonally disposed on the top surface of the substrate body, and the at least two first light-emitting elements are electrically connected between the at least two first top conductive pads, wherein the substrate unit includes at least two second top conductive pads diagonally disposed on the top surface of the substrate body, and the at least two second light-emitting elements are electrically connected between the at least two second top conductive pads.

13. The multichip package structure of claim 12, wherein the substrate unit includes at least one heat-dissipating layer disposed on the bottom surface of the substrate body and corresponding to the light-emitting unit, at least two first bottom conductive pads disposed on the bottom surface of the substrate body and respectively electrically connected to the at least two first top conductive pads, and at least two second bottom conductive pads disposed on the bottom surface of the substrate body and respectively electrically connected to the at least two second top conductive pads.

14. The multichip package structure of claim 13, wherein the substrate unit includes at least two first conductive bodies passing through the substrate body and at least two second conductive bodies passing through the substrate body, each first conductive body is electrically connected between the corresponding first top conductive pad and the corresponding first bottom conductive pad, and each second conductive body is electrically connected between the corresponding second top conductive pad and the corresponding second bottom conductive pad.

15. The multichip package structure of claim 12, wherein the at least two first light-emitting elements are respectively electrically connected to the at least two first top conductive pads through at least two first outer conductive wires, and the at least two first light-emitting elements are respectively electrically connected to the at least two bridging conductive layers through at least two first inner conductive wires, wherein the at least two second light-emitting elements are respectively electrically connected to the at least two second top conductive pads through at least two second outer conductive wires, and the at least two second light-emitting elements are respectively electrically connected to two opposite end portions of the at least one connecting conductive layer, wherein the at least two bridging conductive layers are electrically connected with each other through at least one bridging conductive wire.

16. The multichip package structure of claim 15, wherein each first insulative frame has a first receiving groove for receiving the corresponding first outer conductive wire, the corresponding first inner conductive wire and the corresponding first light-transmitting package body, each second insulative frame has a second receiving groove for receiving the corresponding second outer conductive wire, the corresponding second inner conductive wire and the corresponding second light-transmitting package body, and the at least one bridging conductive wire is received in the first receiving groove of one of the at least two first insulative frames.

17. The multichip package structure of claim 12, wherein each first light-emitting element has at least two first electrodes disposed on the top surface thereof and respectively electrically connected to the corresponding first top conductive pad and the corresponding bridging conductive layer, and each second light-emitting element has at least two second electrodes disposed on the top surface thereof and respectively electrically connected to the corresponding second top conductive pad and the at least one connecting conductive layer.

18. The multichip package structure of claim 11, wherein the at least two first light-emitting elements and the at least two second light-emitting elements are symmetrically arranged in a matrix, and the at least two first insulative frames and the at least two second insulative frames are symmetrically arranged in a matrix.

19. The multichip package structure of claim 10, wherein each first light-transmitting package body is one of phosphor resin body and transparent resin body, and each second light-transmitting package body is one of phosphor resin body and transparent resin body.

20. A multichip package structure for generating a symmetrical and uniform light-blending source, comprising:
a substrate unit including a substrate body;
a light-emitting unit including at least two first light-emitting elements diagonally disposed on the substrate body and electrically connected to the substrate body and at least two second light-emitting elements diagonally disposed on the substrate body and electrically connected to the substrate body, wherein the at least two first light-emitting elements are electrically connected with each other in series, and the at least two second light-emitting elements are electrically connected with each other in series; and
a package unit including at least two first light-transmitting package bodies respectively enclosing the at least two first light-emitting elements and at least two second light-transmitting package bodies respectively enclosing the at least two second light-emitting elements; and
a frame unit including at least two first insulative frames diagonally disposed on the substrate body to respectively surround the at least two first light-emitting elements and at least two second insulative frames diagonally disposed on the substrate body to respectively surround the at least two second light-emitting elements, wherein the at least two first light-transmitting package bodies are respectively surrounded by the at least two first insulative frames, and the at least two second light-transmitting package bodies are respectively surrounded by the at least two second insulative frames.

21. The multichip package structure of claim 20, wherein the substrate unit includes at least two first outer conductive pads diagonally disposed on the top surface of the substrate body, at least one first inner conductive pad disposed between the at least two first outer conductive pads, at least two second outer conductive pads diagonally disposed on the top surface of the substrate body, and at least two second inner conductive pads diagonally disposed between the at least two second outer conductive pads, wherein one of the at least two first light-emitting elements is electrically connected between one of the at least two first outer conductive pads and the at least one first inner conductive pad by wire bonding, another one of the at least two first light-emitting elements is electrically connected between another one of the at least two first outer conductive pads and the at least one first inner conductive pad by wire bonding, one of the at least two second light-emitting elements is electrically connected between one of the at least two second outer conductive pads and one of the at least two second inner conductive pads by wire bonding, and another one of the at least two second light-emitting elements is electrically connected between another one of the at least two second outer conductive pads and another one of the at least two second inner conductive pads by wire bonding.

22. The multichip package structure of claim 21, wherein the substrate unit includes at least two first bottom conductive pads diagonally disposed on the bottom surface of the substrate body and respectively electrically connected to the at least two first outer conductive pads, at least two second bottom conductive pads diagonally disposed on the bottom surface of the substrate body and respectively electrically connected to the at least two second outer conductive pads, and a third bottom conductive pad disposed on the bottom surface of the substrate body, between the at least two first bottom conductive pads and between at least two second bottom conductive pads.

23. The multichip package structure of claim 22, wherein the substrate unit includes at least two first conductive bodies passing through the substrate body to electrically contact the at least two first outer conductive pads and the at least two first bottom conductive pads, at least two second conductive bodies passing through the substrate body to electrically contact the at least two second outer conductive pads and the at least two second bottom conductive pads, and at least two third conductive bodies passing through the substrate body to electrically contact the at least two second inner conductive pads and the at least one third bottom conductive pad, wherein each first conductive body is electrically connected between the corresponding first outer conductive pad and the corresponding first bottom conductive pad, each second conductive body is electrically connected between the corresponding second outer conductive pad and the corresponding second bottom conductive pad, each third conductive body is electrically connected between the corresponding second inner conductive pad and the at least one third bottom conductive pad, and the at least two second light-emitting elements are electrically connected with each other in series through the at least one third bottom conductive pad.

24. The multichip package structure of claim 21, wherein the substrate unit includes a bridging insulative layer covering a bridging portion of the at least one first inner conductive pad and disposed between the at least two second inner conductive pads and a bridging conductive layer covering the bridging insulative layer and electrically connected between the at least two second inner conductive pads, and the at least two second light-emitting elements are electrically connected with each other in series through the bridging conductive layer.

* * * * *